(12) United States Patent
Pyo et al.

(10) Patent No.: US 7,557,441 B2
(45) Date of Patent: Jul. 7, 2009

(54) PACKAGE OF MEMS DEVICE AND METHOD FOR FABRICATING THE SAME

(75) Inventors: Sung-Gyu Pyo, Chungcheongbuk-do (KR); Dong-Joon Kim, Chungcheongbuk-do (KR)

(73) Assignee: MagnaChip Semiconductor Ltd., Chungcheongbuk-do (KR)

( * ) Notice: Subject to any disclaimer, the term of this patent is extended or adjusted under 35 U.S.C. 154(b) by 0 days.

(21) Appl. No.: 11/808,877

(22) Filed: Jun. 13, 2007

(65) Prior Publication Data

US 2008/0029864 A1    Feb. 7, 2008

(30) Foreign Application Priority Data

Jun. 14, 2006    (KR) .................. 10-2006-0053624

(51) Int. Cl.
*H01L 23/12*    (2006.01)
(52) U.S. Cl. ...................................... 257/704; 257/415
(58) Field of Classification Search ................ 257/678, 257/704, 528, 531, 924
See application file for complete search history.

(56) References Cited

U.S. PATENT DOCUMENTS

| 6,601,163 | B1 | 7/2003 | Cromer et al. |
| 6,846,725 | B2 * | 1/2005 | Nagarajan et al. ........... 438/456 |
| 2005/0227401 | A1 | 10/2005 | Lee et al. |

FOREIGN PATENT DOCUMENTS

| JP | 2006-80470 | 3/2006 |
| KR | 2003-0077753 A | 10/2003 |
| KR | 10-0416166 B1 | 1/2004 |
| KR | 10-0575363 B1 | 4/2006 |

* cited by examiner

*Primary Examiner*—Roy K Potter
(74) *Attorney, Agent, or Firm*—Morgan Lewis & Bockius LLP

(57) ABSTRACT

A package of a micro-electro-mechanical systems (MEMS) device includes a cap wafer, a plurality of bonding bumps formed over the cap wafer, a plurality of array bumps arrayed on an outer side of the bonding bumps, and an MEMS device wafer over which a plurality of first outer pads are formed corresponding to the array bumps, wherein the array bumps are bonded to the respective outer pads when the cap wafer and the MEMS device wafer are bonded together.

14 Claims, 23 Drawing Sheets

PACKAGE OF MEMS DEVICE AND METHOD FOR FABRICATING THE SAME

CROSS-REFERENCE TO RELATED APPLICATIONS

The present invention claims priority of Korean patent application number 10-2006-0053624, filed on Jun. 14, 2006, which is incorporated by reference in its entirety.

BACKGROUND OF THE INVENTION

The present invention relates to a semiconductor chip package, and more particularly, to a package of a micro-electro-mechanical systems (MEMS) device and a method for fabricating the same.

In general, MEMS technology is the integration of very small mechanical devices installed inside a semiconductor chip such as sensors, valves, gears, reflecting mirrors, and drivers on a computer. Thus, MEMS are often called intelligent machines. MEMS usually comprise micro-circuits integrated on very small silicon chips installed with very small mechanical devices such as reflecting mirrors and sensors.

MEMS technology recently receives great attention because MEMS technology allows manufacturing of electronic parts using micro-electronic technology under the same cost-effectiveness. Also, MEMS technology becomes the basis of a next generation integration technology, and is considered critical to provide a ubiquitous environment. For this reason, the Korean government set the 'IT839' policy based mainly on the MEMS technology. According to the MEMS technology, instead of fabricating micro-actuators and sensors one by one for each time, several hundreds of micro-actuators and sensors can be simultaneously fabricated on a silicon wafer. The known silicon chip fabrication technology can be directly applied to the MEMS technology. Thus, a numerous number of MEMS devices can be fabricated on a silicon wafer directly using the known semiconductor fabrication processes.

As MEMS technology has been progressively improved, product classes are standardized. Thus, for fabrication processes, product designers can also focus on the design rule, which is based on methods generally used in most of the electronic products.

However, a packaging cost of MEMS devices (e.g., sensors) reaches about 30% to 70% of the total cost. This high cost may impede the commercialization of MEMS unless high-performance and low-cost packaging be achieved. In an attempt to reduce the packaging cost for sensors and others, wafer level chip scale packaging (WLCSP) that allows the implementation of mass-production processes is being vigorously applied. The WLCSP is often considered as one of the critical processes not only in the MEMS technology but also in the typical system in package (SiP) technology. The implementation the WLCSP technology requires developing bonding technology.

Bonding technology which has been currently implemented will be described hereinafter.

First, an anodic bonding method bonds glass (e.g., Pyrex) on a silicon wafer. When a voltage is applied to both ends of the glass at an ascending temperature, a $Na_2O$ component inside the glass is ionized, so that positive ions of $Na^+$ are moved to a negative pole, and negative ions of $O_2^-$ form a layer of charge on the side of a positive pole. Strong electrostatic power is generated between the charge layer of the negative ions and an electrode of aluminum (Al), and a strong bonding is created between the glass and the silicon wafer due to an interfacial chemical reaction. In a wafer level process, while a voltage of 300 V to 1000 V is applied at a temperature of 300° C. to 500° C., the glass is heated and cooled repeatedly for about 3 minutes to 10 minutes so as to create the bonding. At this time, a bonding force is not required greatly.

The above described bonding method is not sensitive to surface roughness, wafer bowing, and particles, and can simply create the bonding in a clean environment because a medium material or a buffer layer is not interposed between the substrate and the target (e.g., glass). Also, the bonding is possible under the condition of applying a voltage less than 1,000 V and a temperature below 400° C. The bonding can also occur between various materials such as metal and glass, glass and glass, and silicon and glass. Moreover, since glass is used as a packaging material, the inside of externally fabricated devices and operation thereof can be visually observed. Since the inside of the devices bonded together is usually hermetic to a vacuum (i.e., airtight characteristic), the bonding method can be applied to a packaging of various vacuum devices. The bonding method can also be implemented to form multiple-layer structures. Thus, the bonding method can be applied to fabricate various three dimensional MEMS. In other words, the bonding method has a wide range of applications. In particular, this type of packaging is biologically compatible, and thus, it can be applied to sensors for medical purposes.

However, this bonding method may have poor compatibility with complementary metal-oxide semiconductor (CMOS) devices because of accumulated alkali ions. Particularly, glass that is applied for the bonding includes sodium (Na), which is one incompatible component in semiconductor fabrication processes, the bonding method may not be applied to the whole semiconductor fabrication process. While the fabrication processes proceed, $O_2$ is likely to be desorbed. As a result, the inner pressure of cavities tends to increase.

According to a fusion bonding method or a silicon direct bonding (SDB) method, two silicon wafers to be bonded together are aligned with each other, and a mechanical spacer is interposed between the two silicon wafers. When the pressure is applied to the resultant structure, the silicon wafers start bonding together from a central portion. In the fusion bonding method or the SDB method, the surface cleanliness and roughness affect the bonding quality. The anodic bonding method needs to be implemented under the surface roughness of 1 μm or less, while the SDB method needs to be implemented under the surface roughness of 4 nm or less. As depicted by this condition, the surface roughness is one important factor in the SDB method.

The fusion bonding takes place in four steps. First, substrates are heated at room temperature until the substrates reach a temperature of 300° C. While the substrates are heated, oxygen ($O_2$), hydrogen ($H_2$), $H_2O$, and hydroxyl (—OH) containing molecules are bonded together, producing hydrogen bonds between the substrates. This step is an initial bonding.

Second, the substrates are heated to a temperature of 700° C. from 300° C. While the substrates are heated, due to the dehydration, the $H_2O$ molecules are detached from the hydrogen bonds and diffused outside. At this stage, the hydrogen bonds are mainly formed by the —OH group containing molecules. Also, the elasticity of the substrates (e.g., silicon substrates) changes, and thus, non-contact portions (i.e., non-bonded portions) of the substrates start contacting with each other.

Third, the heating temperature goes up from 700° C. to 1,000° C. In addition to the $H_2O$ molecules, hydrogen molecules are detached from the hydrogen bonds and vigorously diffused outside. As a result, the bonding is directed towards a state in which the $O_2$ molecules exist on a bonding interface (i.e., the interface between the substrates to be bonded). Also, the elasticity of the substrates changes more than before, thereby creating a strong bonding.

Fourth, the substrates are heated at a high temperature of 1,000° C. or more. Most of the atoms existing on the bonding interface disappear by diffusing into the inside or outside of the substrates (i.e., silicon). At the same time, the elasticity of the substrates changes, thereby providing the complete bonding.

Since the fusion bonding does not use a buffer or spacer usually interposed between the substrates as a medium, a high temperature treatment such as oxidation or diffusion can be performed. Since the bonding materials are substantially the same, their thermal coefficients are also the same. As a result, almost no thermal stress is exerted. The fusion bonding method can be effectively used in fabricating sensors and actuators based on silicon micromachining because various structures can be mechanically worked again by bonding the substrates (e.g., silicon) or performing several processes after the silicon bonding.

However, the fusion bonding is often sensitive to surface roughness, non-uniformity, and particles. In particular, the surface roughness needs to be controlled in an angstrom level. Due to this fact, even though the hermetic sealing is implemented based on strong covalent bonds formed through performing a high thermal annealing treatment at a temperature of 1,100° C., it is difficult to apply the fusion bonding method to semiconductor fabrication processes. A low temperature treatment with a precedent plasma treatment is being actively researched as one approach to overcome this difficulty.

According to a frit glass bonding (i.e., seal glass bonding) method, a glass powder including lead is mixed with a binder to obtain a paste. To achieve a bonding by using various methods such as a screen printer or an extrusion, the paste is placed over a region where MEMS processes proceed and bonded thereto at a temperature of 450° C. The frit glass bonding allows the hermetic sealing, and can be implemented to various vacuum devices. However, the frit glass bonding generally uses lead, which is not environmentally favorable, and occupies a large area in the wafer in addition to a chip area. Hence, the frit glass bonding method may not be implemented to the entire semiconductor fabrication process line.

According to an epoxy bonding (i.e., organic bonding) method, a high polymer such as polyimide or epoxy is used as a bonding medium. Thus, a low temperature treatment can be used in the epoxy bonding. However, the epoxy bonding method may not provide the hermetic sealing. Also, the epoxy boning method may have an aging effect due to a time factor, thereby resulting in a high chance of changing device characteristics. For these reasons, the epoxy bonding method is not currently considered for the implementation.

Among the above bonding methods, the anodic bonding method can provide an effect of using the same silicon wafers. However, the anodic bonding may provide a thermal degradation caused by a high thermal treatment. Accordingly, a wafer-level bonding method that can induce less stress caused by a thermal coefficient and be performed at low temperature needs to be developed to obtain reliable characteristics of MEMS devices.

In an attempt to achieve highly reliable MEMS device characteristics, a deep via formation method, a metal-metal bonding method, or a metal-silicon bonding method is proposed. However, the deep via formation method has the following disadvantages.

First, a bonding method based on the deep via formation and the metal-metal bonding may deteriorate sensors when a metal layer formed over a wafer for an MEMS sensor is etched to form a metal interconnection line. It may be difficult to control an etching for forming a deep via hole in a cap wafer responsible for packaging a top part. This difficulty is likely to affect uniformity in electroplating, further making it difficult to obtain a uniform bonding between the wafers. As a result, a small bonding margin may result, leading to a difficulty in obtaining intended yields. Also, since the cap wafer needs to be ground to a size of about 100 μm, a unit cost is expected to increase, while yields are expected to decrease.

Similar to the above bonding method based on the deep via formation and the metal-metal bonding, a bonding method based on the deep via formation and the metal-silicon bonding may have a difficulty in controlling the depth of a via hole in a cap wafer. A connection between a pad and a sensor wafer may be limited. Securing uniformity in bonding between wafers may be difficult. As a result, the wafers are less likely to be bonded together, thereby resulting in a decrease in yields. Also, the cap wafer needs to be ground to a size of about 100 μm in the bonding method based on the deep via formation and the metal-silicon bonding. Thus, a unit cost is expected to increase, while yields are expected to decrease.

SUMMARY OF THE INVENTION

Specific embodiments of the present invention provide a package of a micro-electro-mechanical systems (MEMS) device using a wafer-level packaging that can be applied to the entire semiconductor fabrication process, and a method for fabricating the same.

In accordance with one aspect of the present invention, there is provided a package of a micro-electro-mechanical systems (MEMS) device. The package includes a cap wafer, a plurality of bonding bumps formed over the cap wafer, a plurality of array bumps arrayed on an outer side of the bonding bumps, and an MEMS device wafer over which a plurality of first outer pads are formed corresponding to the array bumps, wherein the array bumps are bonded to the respective outer pads when the cap wafer and the MEMS device wafer are bonded together.

In accordance with another aspect of the present invention, there is provided a method for fabricating a package of a micro-electro-mechanical systems (MEMS) device. The method includes preparing a MEMS device wafer where a first array mark is formed and a plurality of first outer pads are formed adjacent to the first array mark, preparing a cap wafer where a second array mark, a plurality of bonding bumps, array bumps, and inner interconnection lines are formed, the second array mark formed corresponding to the first array mark, the array bumps respectively coupled to the bonding bumps through inner interconnection lines and formed in a region corresponding to the first outer pads, bonding the MEMS device wafer and the cap wafer in a manner to make the first array mark and the second array mark correspond to each other to thereby bond the fist outer pads and the array bumps together, separating the cap wafer based on the first array mark, and separating the MEMS device wafer based on the second array mark.

DESCRIPTION OF SPECIFIC EMBODIMENTS

Figure 1:
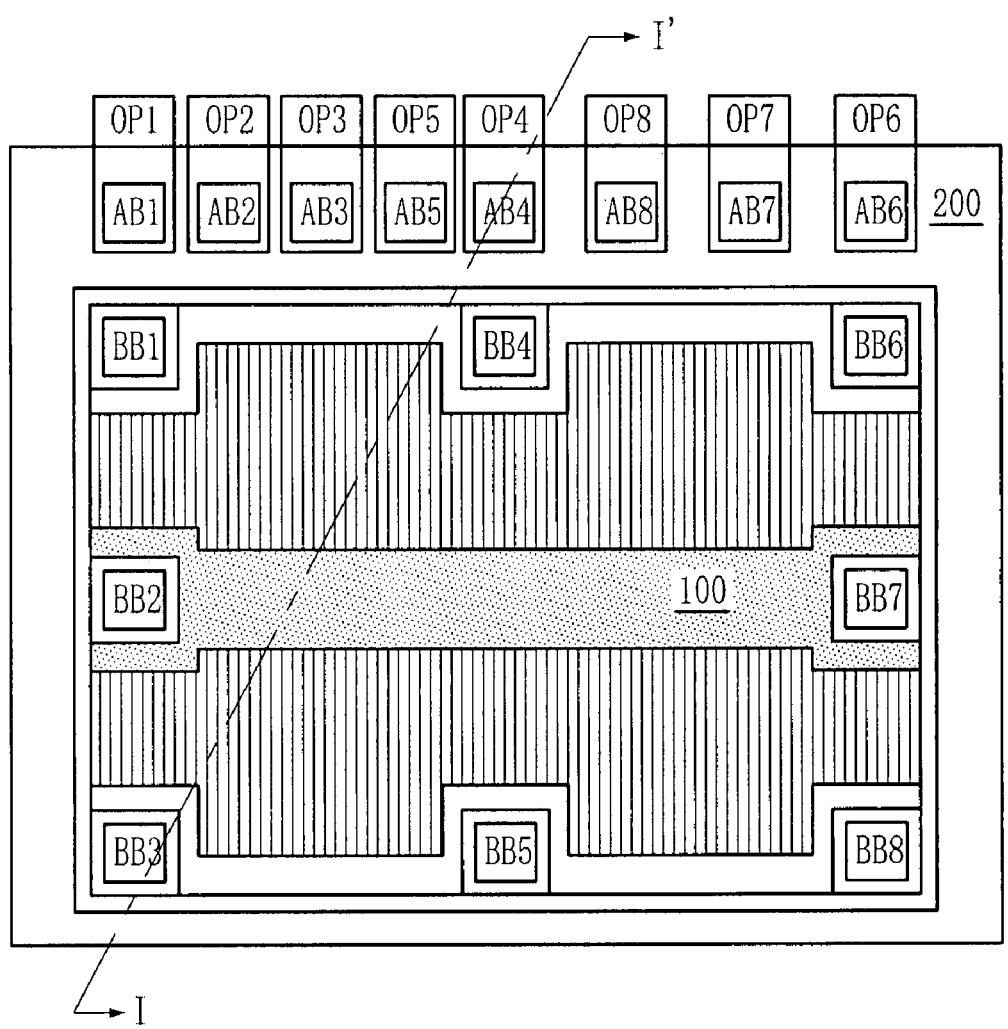
FIG. 1 illustrates a simplified top view of a package of micro-electro-mechanical systems (MEMS) device in accordance with an embodiment of the present invention.

In the following drawings, the thickness of layers and regions are exaggerated for clarity of the description, and when it is described that one layer is formed on another layer or a substrate, the term "on" indicates that the layer may be formed directly on the other layer or the substrate, or a third layer may be interposed therebetween. Also, it should be noted that like reference numerals denote like elements even in different drawings.

Figure 2:
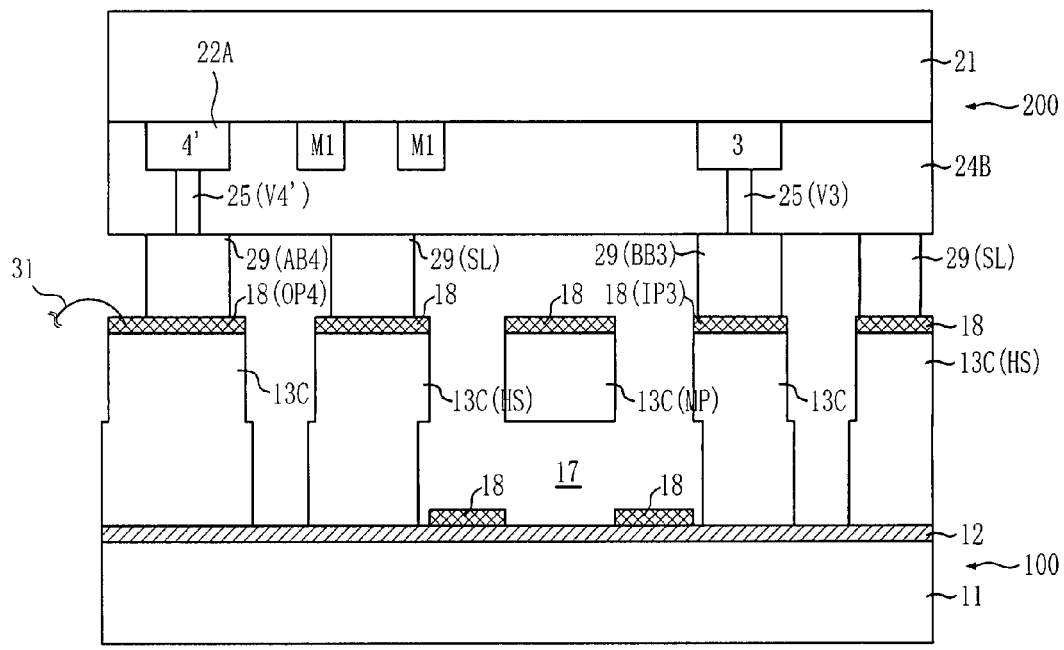
FIG. 2 illustrates a simplified cross-sectional view of the package taken along a line I-I' illustrated in FIG. 1.

FIG. 1 illustrates a simplified top view of a package of micro-electro-mechanical systems (MEMS) device in accordance with an embodiment of the present invention. FIG. 2 illustrates a simplified cross-sectional view of the package taken along a line I-I' illustrated in FIG. 1. Among various MEMS devices, a sensor for acceleration, angular velocity, sound, geomagnetism, or an F-bar value is illustrated. However, the illustrated sensor is provided only as an exemplary embodiment, and other various implementations are possible.

With reference to FIGS. 1 and 2, the package of the MEMS device includes a cap wafer 200 (hereinafter referred to as a first substrate), a plurality of bonding bumps BB1 to BB8, a plurality of array bumps AB1 to AB8, a wafer 100 for use in a MEMS device (hereinafter referred to as a second substrate), and a plurality of outer pads OP1 to OP8. The bonding bumps BB1 to BB8 are formed to encompass a central portion of the first substrate 200. The array bumps AB1 to AB8 are arrayed around the outside of the bonding bumps BB1 to BB8, and electrically coupled to the bonding bumps BB1 to BB8 through inner interconnection lines, respectively. The second substrate 100 and the first substrate 200 are bonded together. The outer pads OP1 to OP8 are formed over the second substrate 100, and electrically coupled to the respective array bumps AB1 to AB8, which are formed over the first substrate 200. The package further includes a sealing line SL and barrier walls HS for a hermetic sealing. The sealing line SL is formed over the first substrate 200 to encompass the bonding bumps BB1 to BB8. The barrier walls HS are formed over a region of the second substrate 100 corresponding to the sealing line SL.

Figure 3:
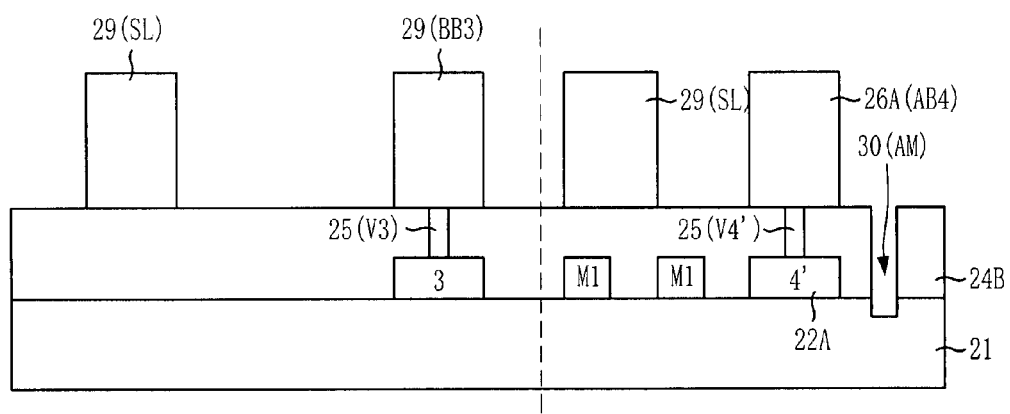
FIG. 3 illustrates a simplified cross-sectional view of a cap wafer illustrated in FIG. 2.
Figure 4:
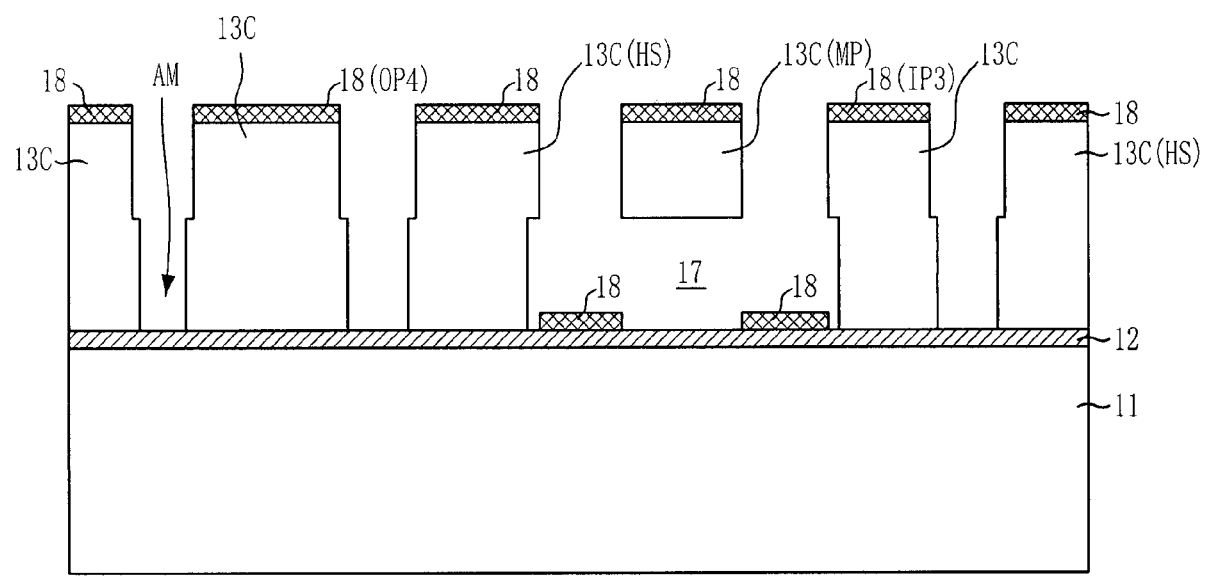
FIG. 4 illustrates a simplified cross-sectional view of an MEMS sensor illustrated in FIG. 2.

With reference to FIGS. 3 and 4, the package taken along a line I-I' illustrated in FIGS. 1 and 2 will be described in detail.

Referring to FIG. 3, the first substrate 200 includes a plurality of inner pads 1 to 8 respectively coupled to the bonding bumps BB1 to BB8, and a plurality of outer pads 1' to 8' respectively coupled to the inner pads 1 to 8 through inner interconnection lines M1. The inner pads 1 to 8, the outer pads 1' to 8', and the inner interconnection lines M1 are simultaneously formed at the same layer level by performing the same metal interconnection line process. The first substrate 200 further includes a first group of via plugs V1 to V8 and a second group of via plugs V1' to V8'. The first group of the via plugs V1 to V8 electrically couple the inner pads 1 to 8 to the respective bonding bumps BB1 to BB8, and the second group of the via plugs V1' to V8' electrically couple the outer pads 1' to 8' to the respective array bumps AB1 to AB8. Hereinafter, the first group of the via plugs V1 to V8 and the second group of the via plugs V1' to V8' will be referred to as first and second plugs, respectively. The first plugs V1 to V8 and the second plugs V1' to V8' are formed at the same layer level by performing a single damascene process. Also, reference numerals 21 and 24B represent a silicon oxide (e.g., $SiO_2$) layer and an insulation layer where the first plugs V1 to V8 and the second plugs V1' to V8' are formed, respectively.

As illustrated, the bonding bumps BB1 to BB8 may be formed in the total number of 8 over the first substrate 200 such that the sealing line SL encompasses the bonding bumps BB1 to BB8. Four of the bonding bumps BB1 to BB8 are formed in respective four corners of the sealing line SL. The rest four of the bonding bumps BB1 to BB8 are formed in respective regions between the four corners of the sealing line SL. When the first substrate 200 and the second substrate 100 are bonded together, the bonding bumps BB1 to BB8 are electrically coupled to respective inner pads IP1 to IP8, which are formed over the second substrate 100. The number and position of the bonding bumps BB1 to BB8 are not limited to the above implementation, and can be adjusted according to the design.

The sealing line SL is formed to provide a hermetic sealing when the first substrate 200 and the second substrate 100 are bonded together. As mentioned above, the sealing line SL is formed to encompass the bonding bumps BB1 to BB8. During the bonding of the first and second substrates 200 and 100, the sealing line SL bonds to the barrier walls HS.

The array bumps AB1 to AB8 may be formed sequentially on the outer side of one surface of the sealing line SL, which is provided in the form of a square fence, such that the array bumps AB1 to AB8 correspond to the outer pads OP1 to OP8, which are formed over the second substrate 100. Alternatively, depending on the design, the array bumps AB1 to AB8 are divided into certain number of groups each placed over each surface of the sealing line SL. When the first and second substrates 200 and 100 are bonded together, the array bumps AB1 to AB8 are bonded to the respective outer pads OP1 to OP8 formed over the second substrate 100.

Referring to FIG. 4, the second substrate 100 includes a silicon on insulator (SOI) substrate 11, an oxide-based insulation layer 12, a low-resistance silicon-based layer 13C that is patterned three times, and metal pads 18 formed over the third patterned silicon-based layer 13C.

The third patterned silicon-based layer 13C is an epitaxial layer. The third patterned silicon-based layer 13C functions as a moving part MP including a plurality of patterns that are separated from each other, as a fixing part serving as supporting layers that support the inner pads IP1 to IP8 of the second substrate 100, and as the barrier walls HS for the hermetic sealing. A cavity 17 is formed between the fixing part and the barrier walls HS. The third patterned silicon-based layer 13C also supports the outer pads OP1 to OP8, which are formed on the outer side of the barrier walls HS (i.e., the regions corresponding to the array bumps AB1 to AB8 of the first substrate 200).

As illustrated in FIGS. 2 to 4, the moving part MP has a shape like the teeth of a comb. The moving part MP including the separated patterns is separated from the second substrate 100. However, the moving part MP is supported by the inner pads IP1 to IP8 that actually function as the fixing part.

The inner pads IP1 to IP8 of the second substrate 100 are formed to correspond to the inner pads 1 to 8 of the first substrate 200 to contact the respective bonding bumps BB1 to BB8 formed over the first substrate 200 when the first substrate 200 and the second substrate 100 are bonded together.

When the first and second substrates 200 and 100 are bonded together, the barrier walls HS are bonded to the sealing line SL of the first substrate 200, so as to pack the inner side of the package, which is obtained by bonding the first and second substrates 200 and 100 together.

The outer pads OP1 to OP8 of the second substrate 100 are used to provide a wire bonding 31 with an external device. For instance, the outer pads OP1 to OP8 are electrically coupled to a printed circuit board (PCB) through the wire bonding 31.

The bonding bumps BB1 to BB8, the sealing line SL, the array bumps AB1 to AB8, and the outer pads OP1 to OP8 each can be formed by a under bump metallization (UBM) process. Each of the bonding bumps BB1 to BB8, the sealing line SL, the array bumps AB1 to AB8, and the outer pads OP1 to OP8 is formed in a single layer including one selected from a first group consisting of Ti TiW, Ni, Cu, W, Au, Pt, Ag, Al, NiV, and CrV, or in a stack structure including one selected from the first group and another selected from a second group consisting of Au, Cu, and Ni, which is formed over a layer of the material selected from the first group. Each of the bonding bumps BB1 to BB8, the sealing line SL, and the array bumps AB1 to AB8 each can be formed in a UBM layer/Cu/solder cap structure or a UBM layer/Au/solder cap structure. At this time, the UBM layer is formed in a single layer including one selected from a first group consisting of Ti TiW, Ni, Cu, W, Au, Pt, Ag, Al, NiV, and CrV, or in a stack structure including one selected from the first group and another selected from a second group consisting of Au, Cu, and Ni, which is formed over a layer of the material selected from the first group. Each of the bonding bumps BB1 to BB8, the sealing line SL, the array bumps AB1 to AB8, and the outer pads OP1 to OP8 may also include a material selected from a group consisting of Au, Cu, and Ni.

A method for fabricating the package of the MEMS device illustrated in FIGS. 1 to 4 will be described hereinafter.

Figure 5:
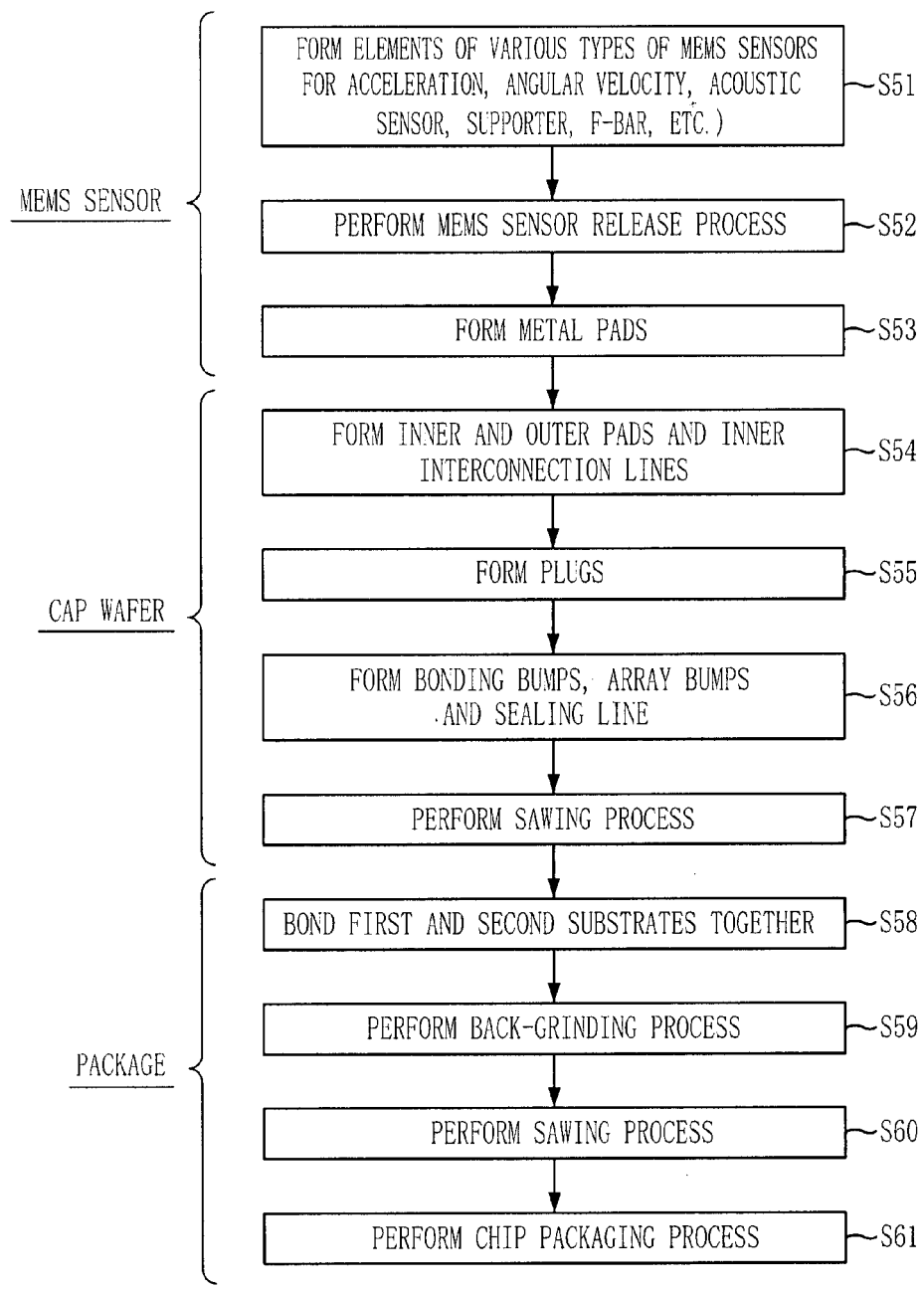
FIG. 5 illustrates a simplified flowchart for a method for fabricating a package of a MEMS device in accordance with an embodiment of the present invention.

FIG. 5 illustrates a simplified flowchart for a fabrication method of the package of the MEMS device in accordance with an embodiment of the present invention. In particular, FIG. 5 illustrates the fabrication of the package by fabricating the MEMS device first and then the cap wafer. However, this order is merely illustrative. In other words, the MEMS device and the cap wafer can be fabricated in a reversible order from the illustrated one, or at the same time.

With reference to FIG. 5, an MEMS sensor is fabricated as follows. At steps S51 and S52, a patterning process and a release process are performed to form elements of various types of MEMS sensors for acceleration, angular velocity, sound, geomagnetism, or an F-bar value. At step S53, a metal pad formation process is performed to form outer pads OP1 to OP8. With reference to FIGS. 6A to 6I, detailed description of 'S51' to 'S53' will be described in detail.

Figure 6A:
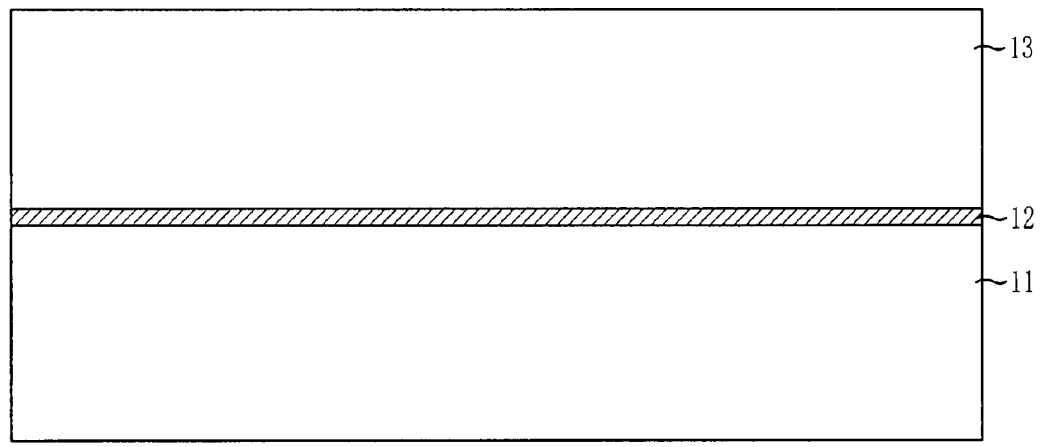
FIGS. 6A to 6I illustrate simplified cross-sectional views of structures associated with 'S51' through 'S54' illustrated in FIG. 5.
Figure 6B:
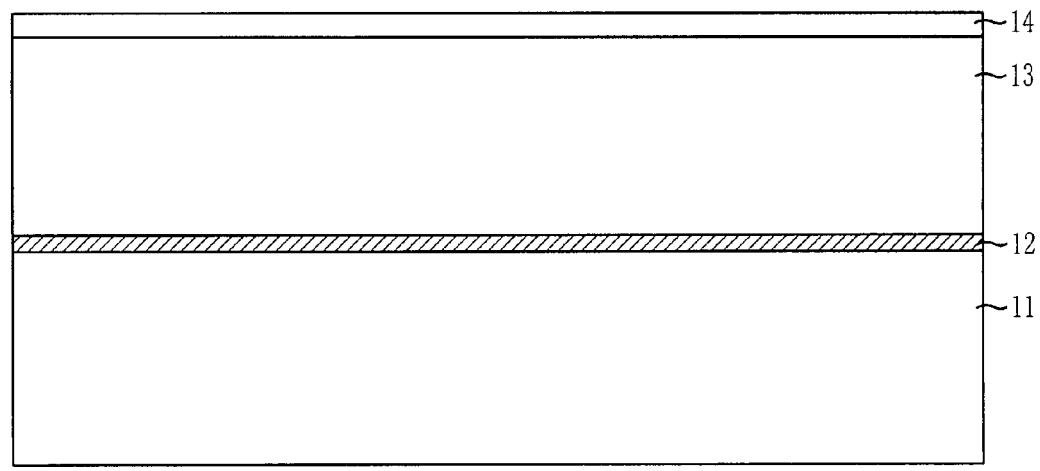
Figure 6C:
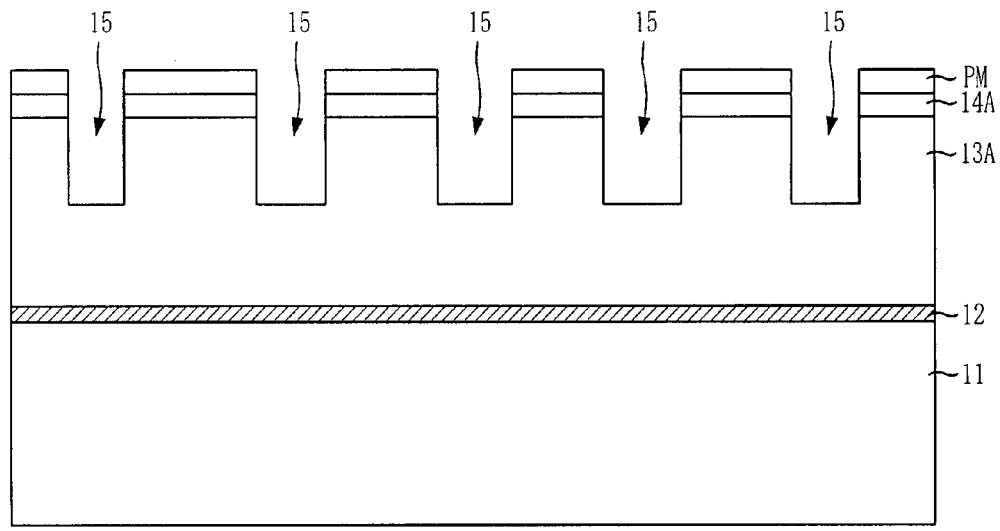

Referring to FIG. 6A, an insulation layer 12 (e.g., an oxide-based layer) and a silicon-based layer 13 are formed over a low-resistance SOI substrate 11. Referring to FIG. 6B, a hard mask layer 14 is formed over the silicon-based layer 13. Referring to FIG. 6C, a photoresist pattern PM is formed over the hard mask layer 14. The hard mask layer 14 is etched using the photoresist pattern PM as an etch mask to form a hard mask 14A and a plurality of first trenches 15. Among the first trenches 15, the first trench 15 on the left end side is used as an array mark AM and corresponds to an opening 30 for another array mark AM (see FIG. 16D). The first trench 15 that is most adjacent to the above first trench 15 on the left end side defines supporting layers that support the outer pads OP1 to OP8. The rest of the first trenches 15 define the moving part of the MEMS sensor. Reference numeral 13A denotes a first patterned silicon-based layer.

Figure 6D:
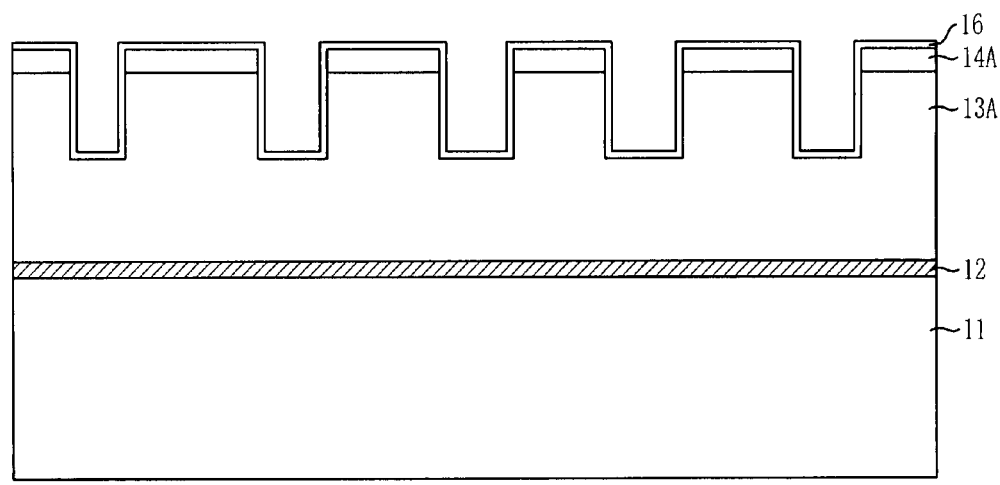
Figure 6E:
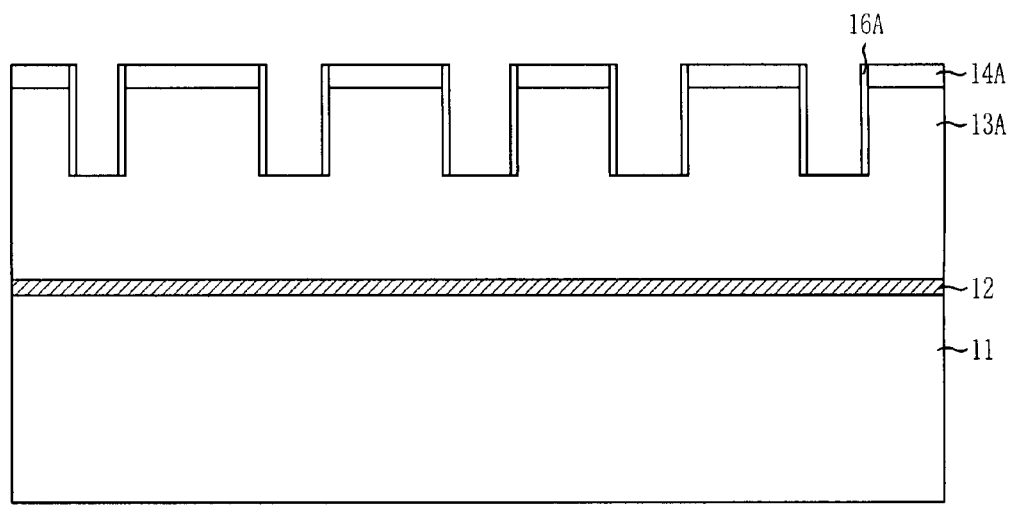

Referring to FIG. 6D, the photoresist pattern PM is removed. A passivation layer 16 is formed over the resultant structure illustrated in FIG. 6C. Referring to FIG. 6E, the passivation layer 16 is etched to form a passivation pattern 16A in the form of a spacer on the inner sidewalls of each of the first trenches 15.

Figure 6F:
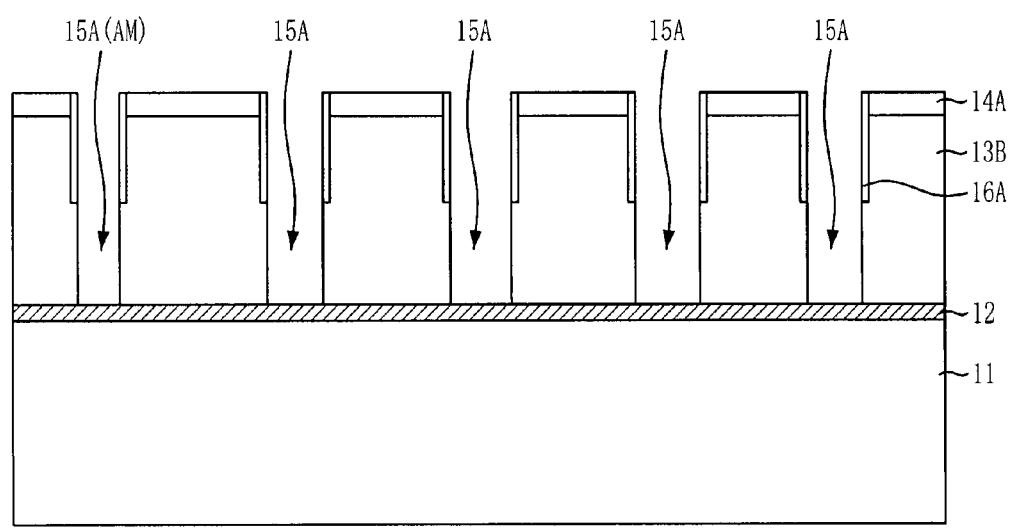

Referring to FIG. 6F, a bottom portion of each of the first trenches 15 is etched until the insulation layer 12 is exposed. As a result, a plurality of second trenches 15A for use in the array mark AM and the fixing and moving parts of the MEMS sensor are formed. Reference numeral 13B represents a second patterned silicon-based layer.

Figure 6G:
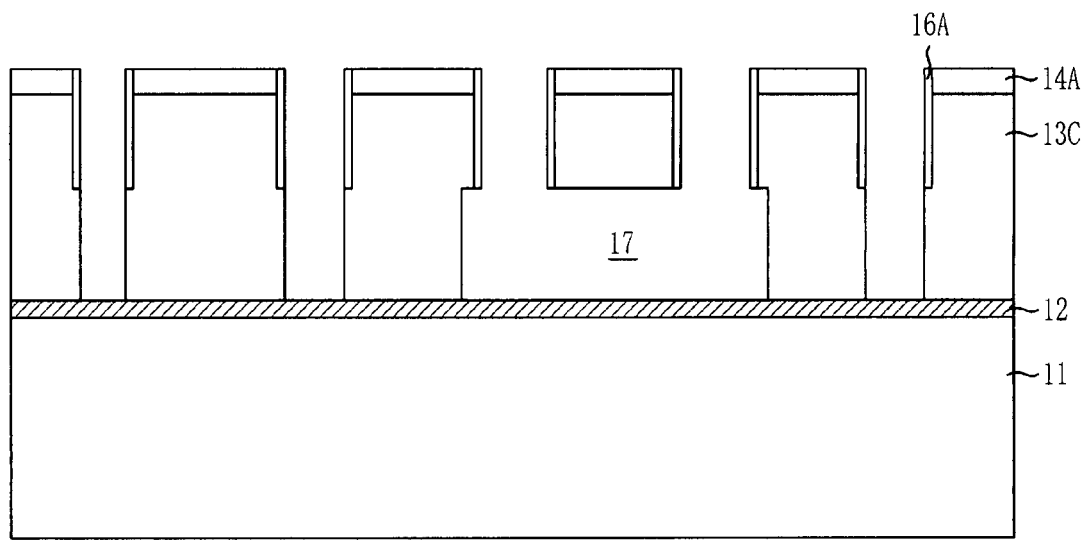

Referring to FIG. 6G, using the passivation pattern 16A as an etch mask, a bottom sidewall portion of the second trenches 15 is etched in a horizontal direction to form a cavity 17. The etching proceeds employing a wet etching, and is often called 'silicon release process'. Reference numeral 13C represents a third patterned silicon-based layer.

Figure 6H:
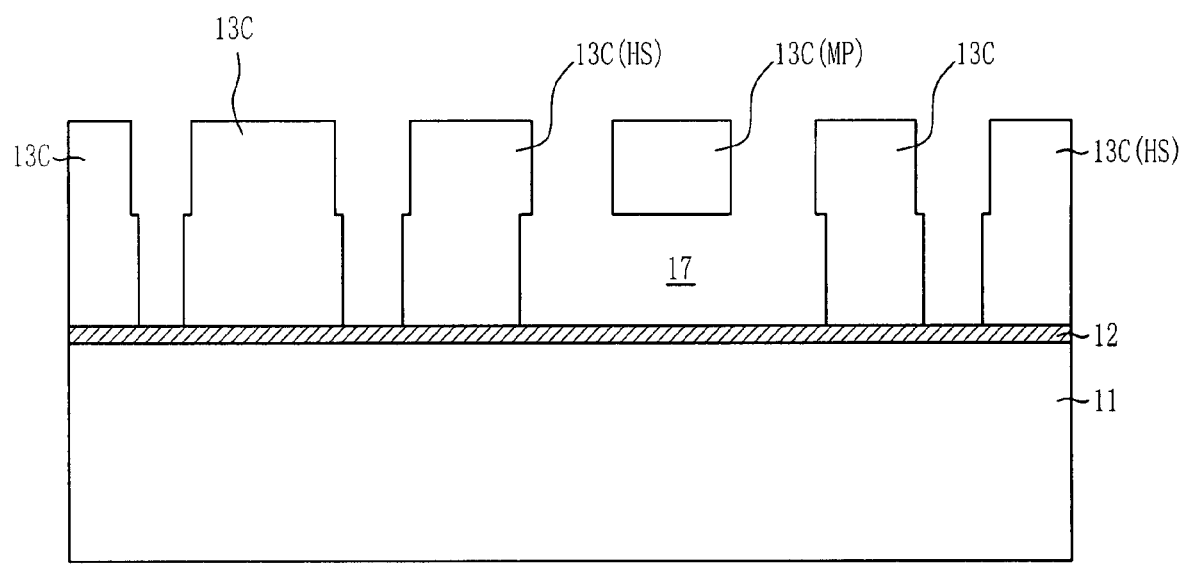
Figure 6I:
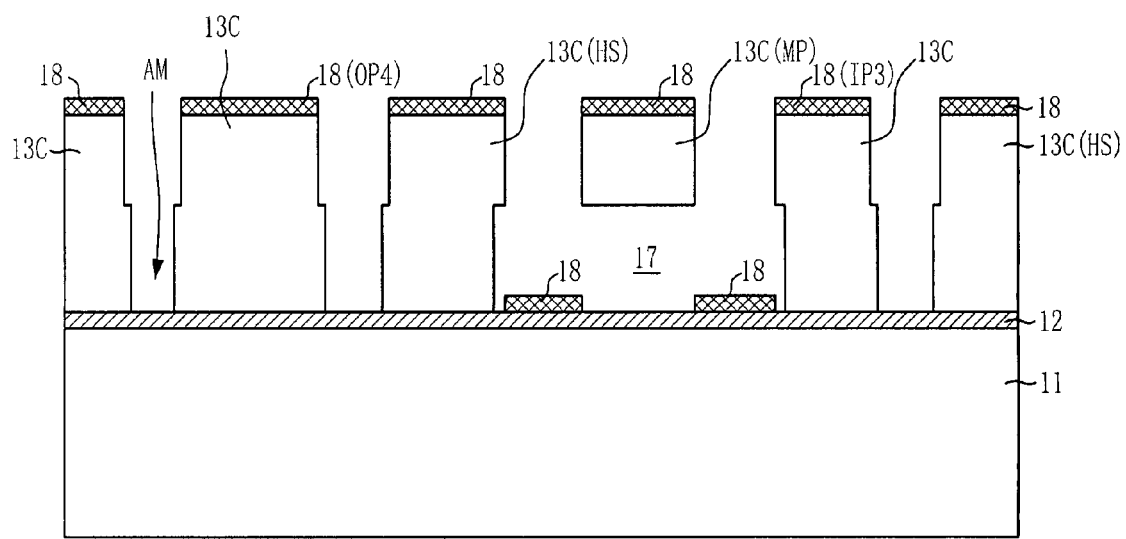

Referring to FIG. 6H, the hard mask 14A and the passivation pattern 16A are removed to form sensor structures, more specifically, a moving part MP, a plurality of inner pads IP1 to IP8, barrier walls HS, and a support structure for the outer pads OP1 to OP8. Referring to FIG. 6I, metal pads 18 are formed over the upper surface of the third patterned silicon-based layer 13C using a metal deposition method. The metal deposition method is performed to form the metal pads 18 in an UBM/metal stack structure or a single metal layer. The UBM layer includes one selected from a group consisting of TiW/Au, Ti, TiW, Ni, Cu, W, Au, Pt, Ag, Al, NiV, and CrV, and the metal layer includes one selected from a group consisting of Au, Cu, and Ni. As a result of the metal deposition method, the outer pads OP1 to OP8 are formed.

Figure 7:
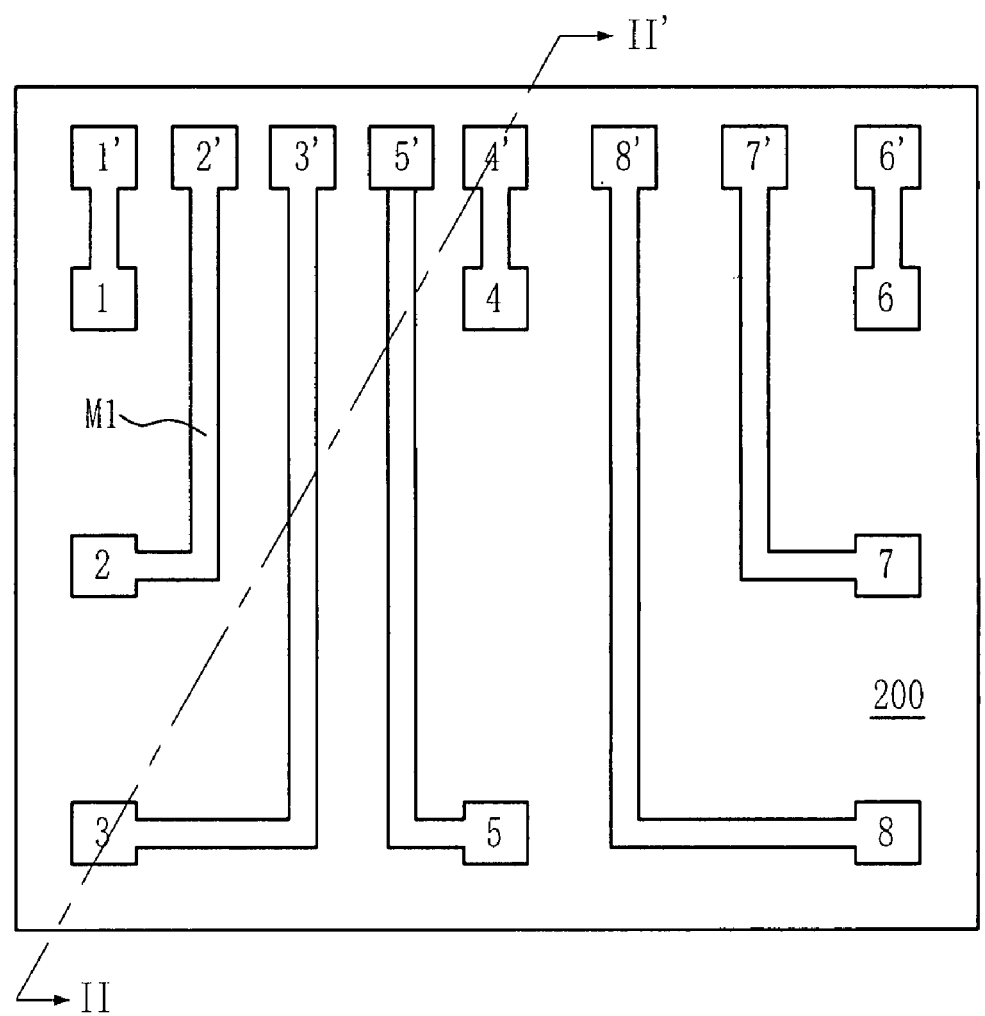
FIG. 7 illustrates a simplified top view of a structure associated with 'S54' illustrated in FIG. 5.

With reference to FIG. 5, the fabrication of the cap wafer will be described. At step S54, a plurality of inner pads 1 to 8, a plurality of outer pads 1' to 8', and inner interconnection lines M1 are formed over a first substrate 200 where a silicon oxide layer 21 (e.g., SiO$_2$ layer) is formed. With reference to FIG. 7 and FIGS. 8A to 8D, the formation of the inner pads 1 to 8, the outer pads 1' to 8', and the inner interconnection lines M1 (i.e., step 'S54') will be described in detail. FIG. 7 illustrates a simplified top view of a structure associated with 'S54'. FIGS. 8A to 8D illustrate simplified cross-sectional views of structures obtained after certain processes taken along a line II-II' illustrated in FIG. 7.

Figure 8A:
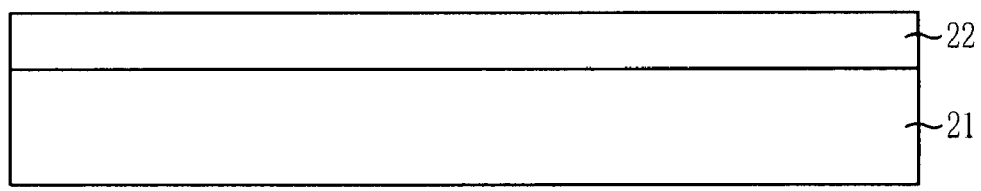
FIGS. 8A to 8D illustrate simplified cross-sectional views of structures formed after certain processes taken along a line II-II' illustrated in FIG. 7.
Figure 8B:
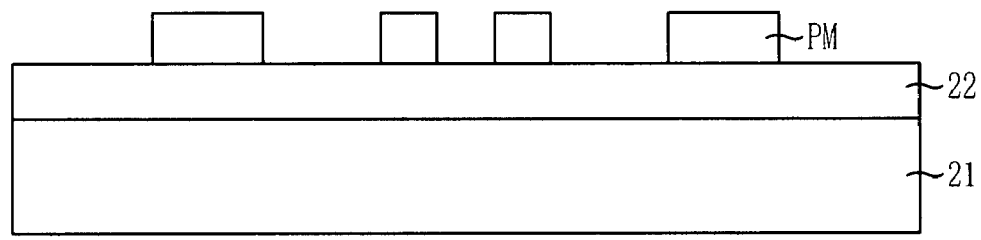
Figure 8C:
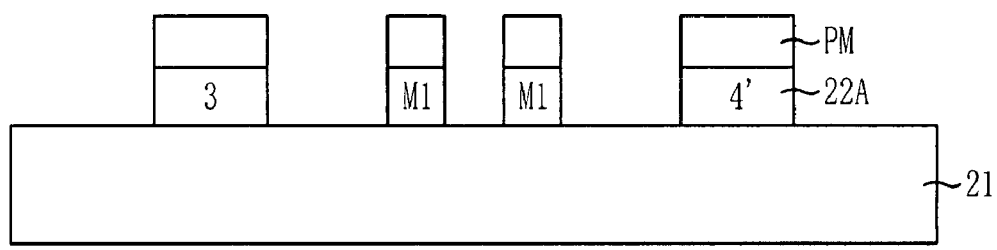
Figure 8D:
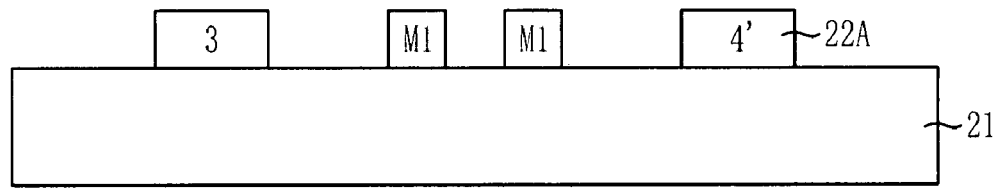

Referring to FIG. 8A, a conductivity layer 22 is formed over the first substrate 200 where the silicon oxide layer 21 is formed. The conductivity layer 22 includes aluminum (Al), and will be referred to as an Al layer hereinafter. Referring to FIG. 8B, a photoresist layer is formed over the Al layer 22, and exposed to light and developed using a photomask to form a photoresist pattern PM. Referring to FIG. 8C, the Al layer 22 (see FIG. 8B) is etched using the photoresist pattern PM as an etch mask to form patterned Al layers 22A. The patterned Al layers 22A function as the inner pads 1 to 8, the outer pads 1' to 8', and the inner interconnection lines M1 that respectively couple the inner pads 1 to 8 to the outer pads 1' to 8'. Referring to FIG. 8D, the photoresist pattern PM is removed.

Figure 9:
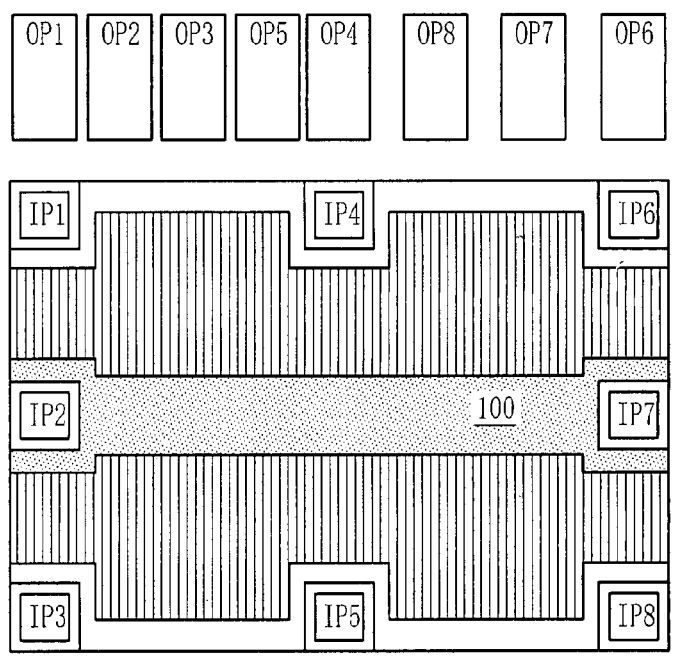
FIG. 9 illustrates a simplified top view of an MEMS sensor corresponding to the cap wafer illustrated in FIG. 7.
Figure 10:
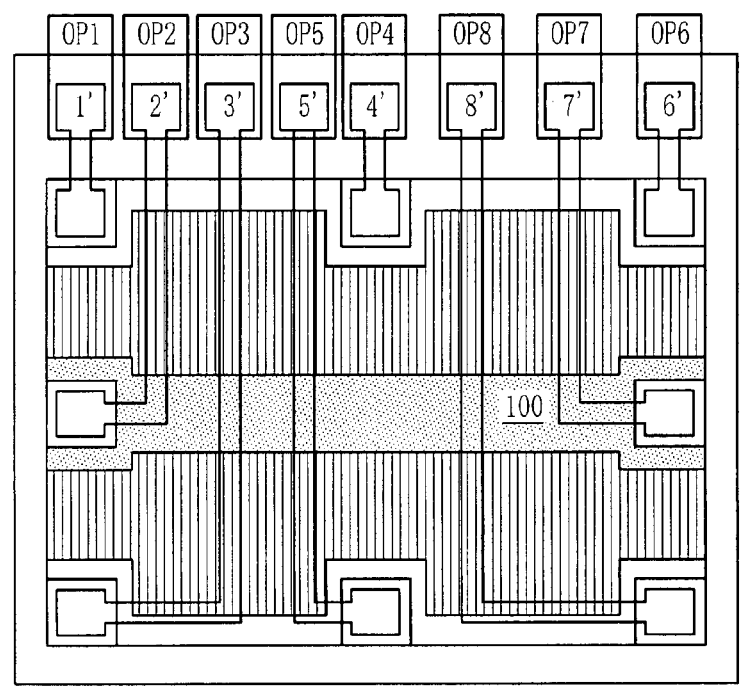
FIG. 10 illustrates a simplified top view of the cap wafer illustrated in FIG. 7 and the MEMS sensor illustrated in FIG. 9 after being bonded together.

After the completion of the serial processes illustrated in FIGS. 8A to 8D, the inner pads 1 to 8, the outer pads 1' to 8' and the inner interconnection lines M1 are formed. The inner pads 1 to 8 are formed in regions corresponding to regions where the inner pads IP1 to IP8 of the second substrate 100 (e.g., an MEMS sensor die) illustrated in FIG. 9. When the first substrate 200 and the second substrate 100 are bonded together, as illustrated in FIG. 10, the inner pads 1 to 8 of the first substrate 200 and the inner pads IP1 to IP8 of the MEMS sensor die are bonded together in a manner to face each other correspondingly. The regions where the outer pads 1' to 8' of the first substrate 200 are formed correspond to the regions where the outer pads OP1 to OP8 of the MEMS sensor (i.e., the second substrate 100) illustrated in FIG. 9. As illustrated in FIG. 10, when the first and second substrates 200 and 100 are bonded together, the outer pads 1' to 8' of the first substrate 200 are bonded to the respective outer pads OP1 to OP8 of the second substrate 100.

Figure 11:
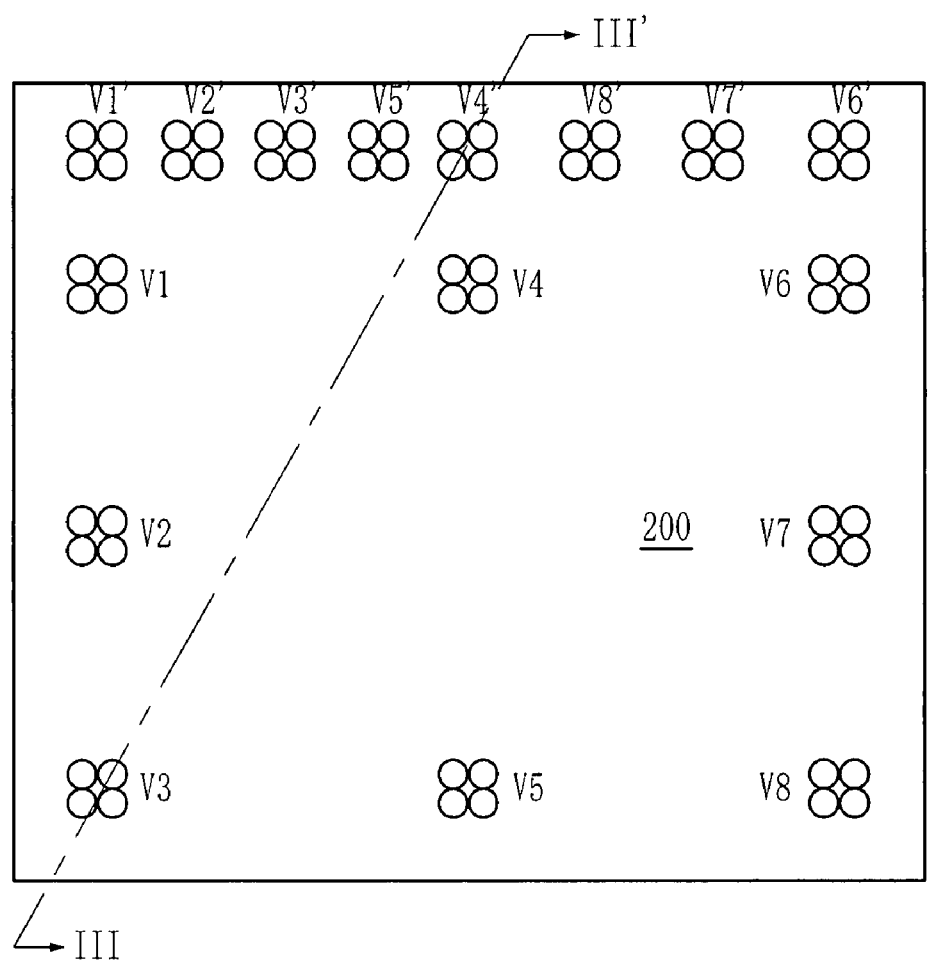
FIG. 11 illustrates a simplified top view of a structure associated with 'S55' illustrated in FIG. 5.

At step S55, first plugs V1 to V8 and second plugs V1' to V8' are formed. With reference to FIG. 11 and FIGS. 12A to 12D, detailed description of 'S55' will be provided hereinafter. FIG. 11 illustrates a simplified top view of a structure associated with 'S55' illustrated in FIG. 5. FIGS. 12A to 12D illustrate cross-sectional views of structures obtained after certain processes taken along a line III-III' illustrated in FIG. 11.

Figure 12A:
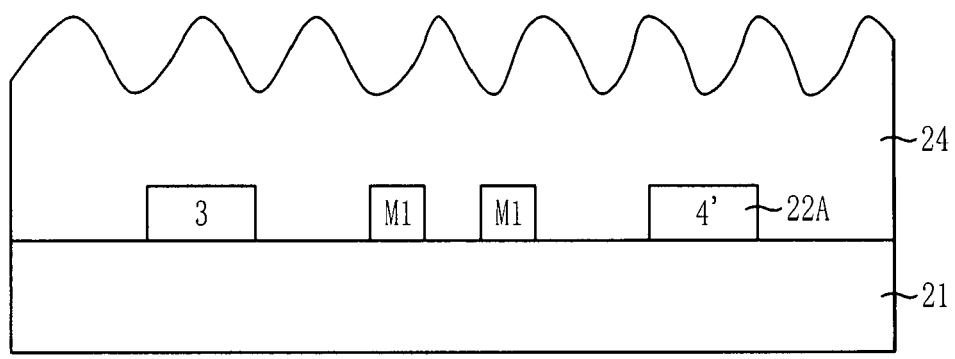
FIGS. 12A to 12D illustrate cross-sectional views of structures formed after certain processes taken along a line III-III' illustrated in FIG. 11.

Referring to FIG. 12A, an insulation layer 24 is formed over the resultant structure illustrated in FIG. 8D. The insulation layer 24 includes an oxide-based material. For instance, the insulation layer 24 may be a borophosphosilicate glass (BPSG) layer, a phosphosilicate glass (PSG) layer, a tetraethyl orthosilicate (TEOS) layer, a spin on glass (SOG) layer, or a spin on dielectric (SOD) layer.

Figure 12B:
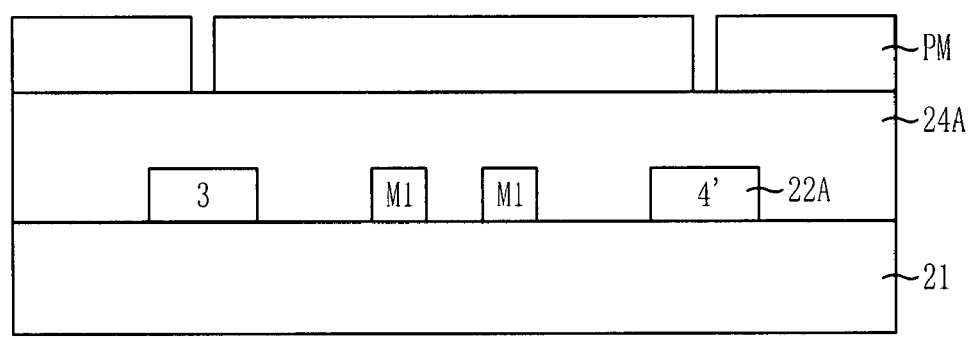
Figure 12C:
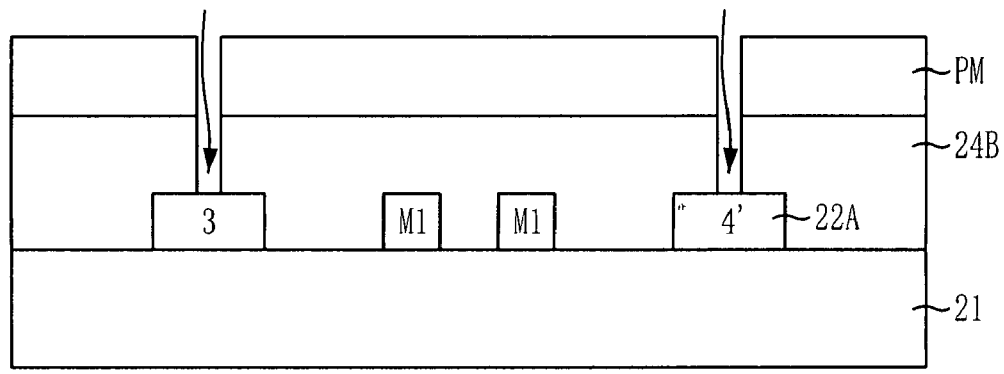
Figure 12D:
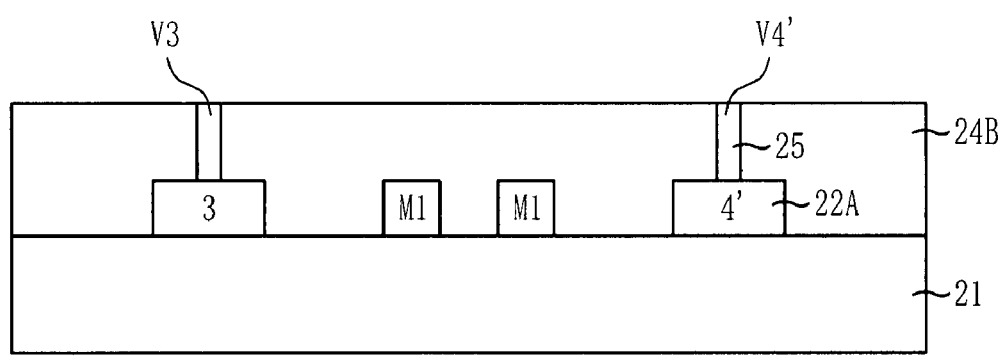

Referring to FIG. 12B, the insulation layer 24 (see FIG. 12A) is planarized by chemical mechanical polishing (CMP). A photoresist pattern PM is formed over a planarized insulation layer 24A. Referring to FIG. 12C, the planarized insulation layer 24A is etched using the photoresist pattern PM as an etch mask to form via holes (see regions indicated by arrows) that expose the inner pads 1 to 8 and the outer pads 1' to 8'. Reference numeral 24B represents an insulation layer in which the via holes are formed in the planarized insulation layer 24A. Referring to FIG. 12D, the photoresist pattern PM is removed. A tungsten (W) layer 25 fills the via holes, and is planarized by CMP to form the first plugs V1 to V8 and the second plugs V1' to V8' that are respectively coupled to the inner pads 1 to 8 and the outer pads 1' to 8'.

Figure 13:
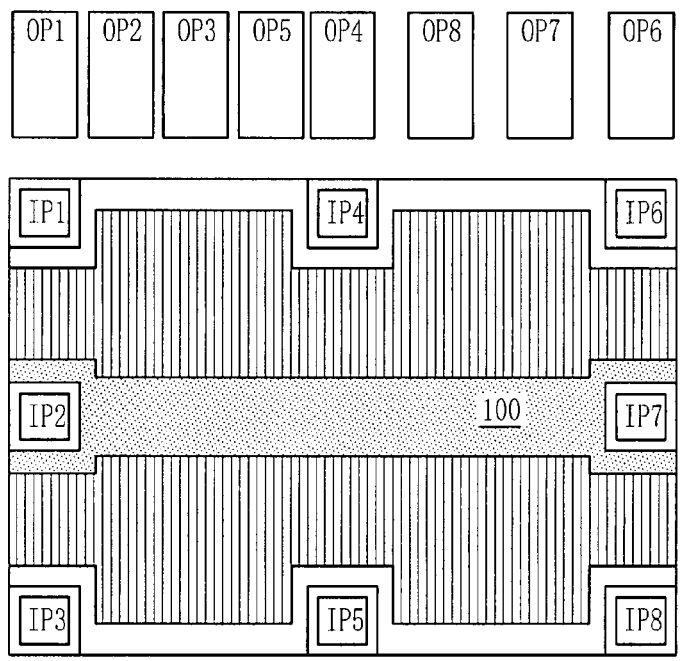
FIG. 13 illustrates a simplified top view of an MEMS sensor corresponding to the cap wafer illustrated in FIG. 11.
Figure 14:
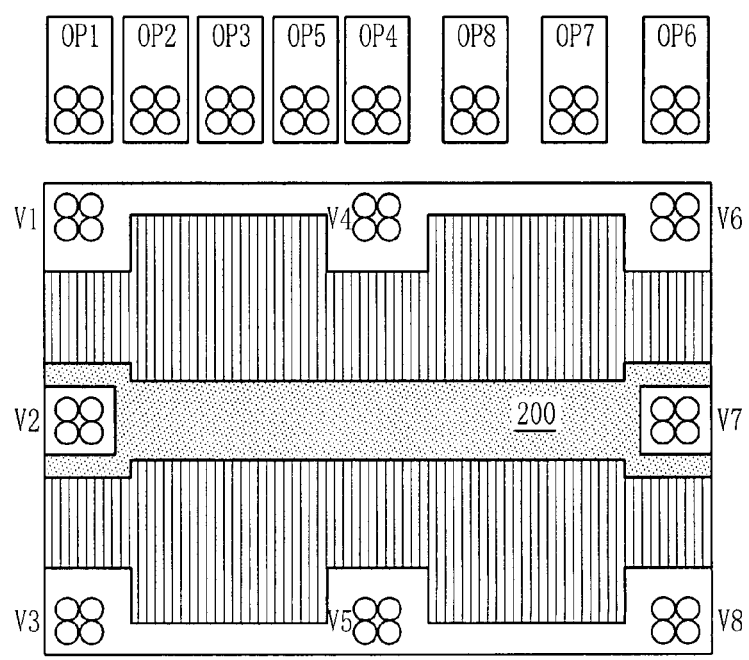
FIG. 14 illustrates a simplified top view of the cap wafer illustrated in FIG. 11 and the MEMS sensor illustrated in FIG. 13 after being bonded together.

After the completion of the serial processes illustrated in FIGS. 12A to 12D, as illustrated in FIG. 11, the first plugs V1 to V8, which are coupled to the respective inner pads 1 to 8, and the second plugs V1' to V8', which are coupled to the respective outer pads 1' to 8', are formed. As illustrated in FIGS. 13 and 14, the regions where the first plugs V1 to V8 correspond to the regions where the inner pads IP1 to IP8 of the MEMS sensor die (i.e., the second substrate 100) are formed when the first substrate 200 and the second substrate 100 are bonded together.

Figure 15:
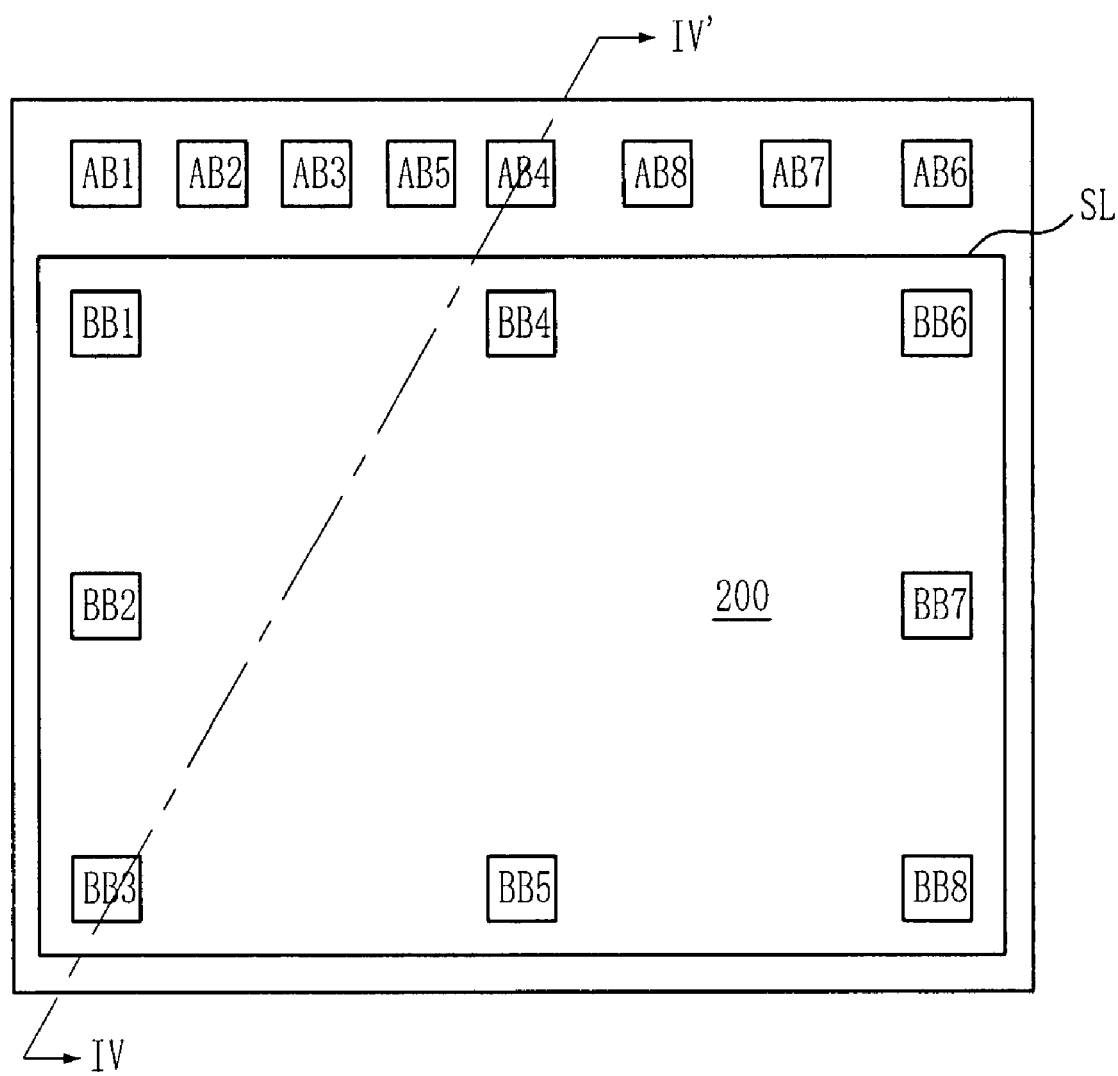
FIG. 15 illustrates a top view of a structure associated with 'S56' illustrated in FIG. 5.

At step S56, bonding bumps BB1 to BB8, array bumps AB1 to AB8, and a sealing line SL are formed. With reference to FIG. 15 and FIGS. 16A to 16D, the formation of the bonding bumps BB1 to BB8, the array bumps AB1 to AB8, and the sealing line SL will be described in detail. FIG. 15 illustrates a top view of a structure associated with 'S56' illustrated in FIG. 5. FIGS. 16A to 16D illustrate simplified cross-sectional views of structures obtained after certain processes taken along a line IV-IV' illustrated in FIG. 15.

Figure 16A:
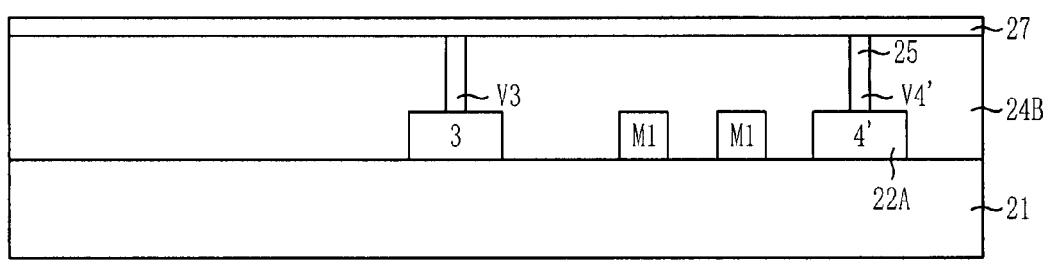
FIGS. 16A to 16D illustrate simplified cross-sectional views of structure obtained after certain processes taken along a line IV-IV' illustrated in FIG. 15.
Figure 16B:
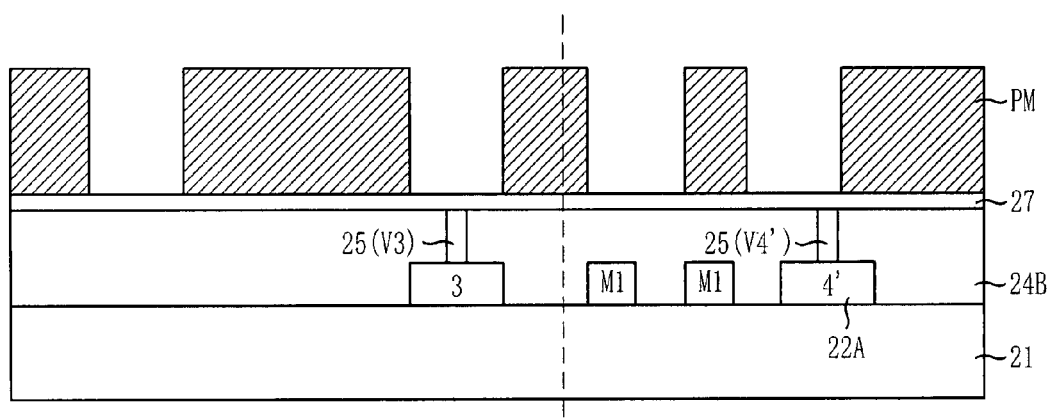
Figure 16C:
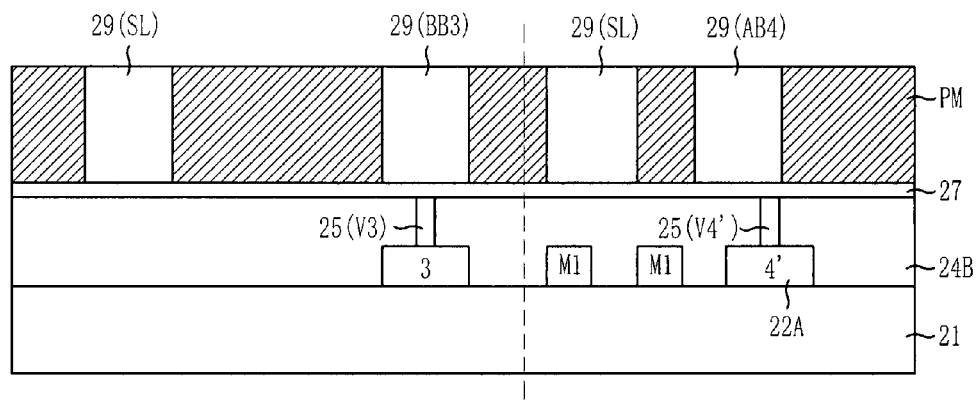

Referring to FIG. 16A, a seed layer 27 is formed over the resultant structure illustrated in FIG. 12D. In the present embodiment, the seed layer 27 includes gold (Au). Referring to FIG. 16B, a photoresist pattern PM is formed. Referring to FIG. 16C, a metal layer 29 for forming the bonding bumps BB1 to BB8, the array bumps AB1 to AB8, and the sealing line SL is formed performing electroplating using the photoresist pattern PM. The metal layer 29 can be formed using UBM, and includes one selected from a first group consisting of TiW/Au, Ti TiW, Ni, Cu, W, Au, Pt, Ag, Al, NiV, and CrV, or in a stack structure including one selected from the first group and another selected from a second group consisting of Au, Cu, and Ni, which is formed over a layer of the material selected from the first group.

Figure 16D:
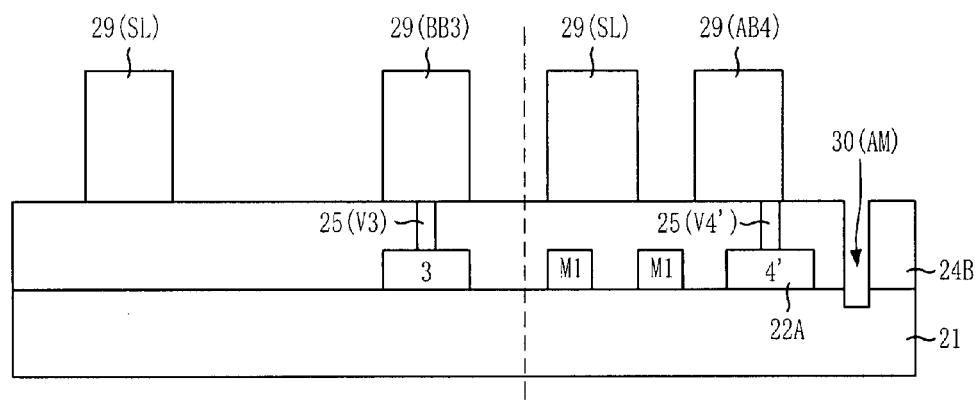

Referring to FIG. 16D, the photoresist pattern PM is removed. Portions of the seed layer 27 are etched away to form the bonding bumps BB1 to BB8, the array bumps AB1 to AB8, and the sealing line SL. The insulation layer 24B where the first plugs V1 to V8 and the second plugs V1' to V8' are formed and the silicon oxide layer 21 exposed on the outer side of the array bumps AB1 to AB8 are removed by a sawing process to form the aforementioned opening 30 for use in the other array mark AM. The array marks AM are formed to align the array bumps AB1 to AB8 and the outer pads OP1 to OP8 with each other when the first and second substrates 200 and 100 are bonded together.

As illustrated in FIG. 16D, the bonding bumps BB1 to BB8, the array bumps AB1 to AB8, and the sealing line SL are formed to have substantially the same width to minimize the height variation. The bonding bumps BB1 to BB8 and the sealing line SL are formed to have an area that is about 7% to 35% of the total area of the first substrate 200 because the bonding intensity between the first substrate 200 and the second substrate 100 is not usually affected by the bonding bumps BB1 to BB8 and the sealing line SL to a great extent. In other words, the above area needs to be secured to maintain a sufficient level of the bonding intensity between the first substrate 200 and the second substrate 100 during performance of a subsequent back-grinding process. For instance, the bonding bumps BB1 to BB8 and the sealing line SL are formed to a thickness of about 10 μm to 30 μm in order to secure a space for installing the moving part MP of the MEMS sensor. The bonding bumps BB1 to BB8 and the sealing line SL are formed to a width of about 10 µm to 100 µm considering the bonding intensity.

Figure 17:
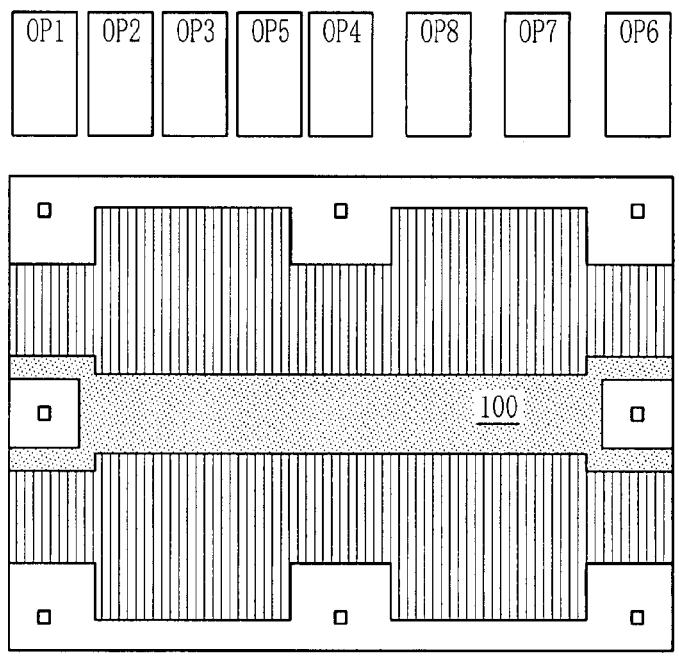
FIG. 17 illustrates a simplified top view of an MEMS sensor corresponding to the cap wafer illustrated in FIG. 15.
Figure 18:
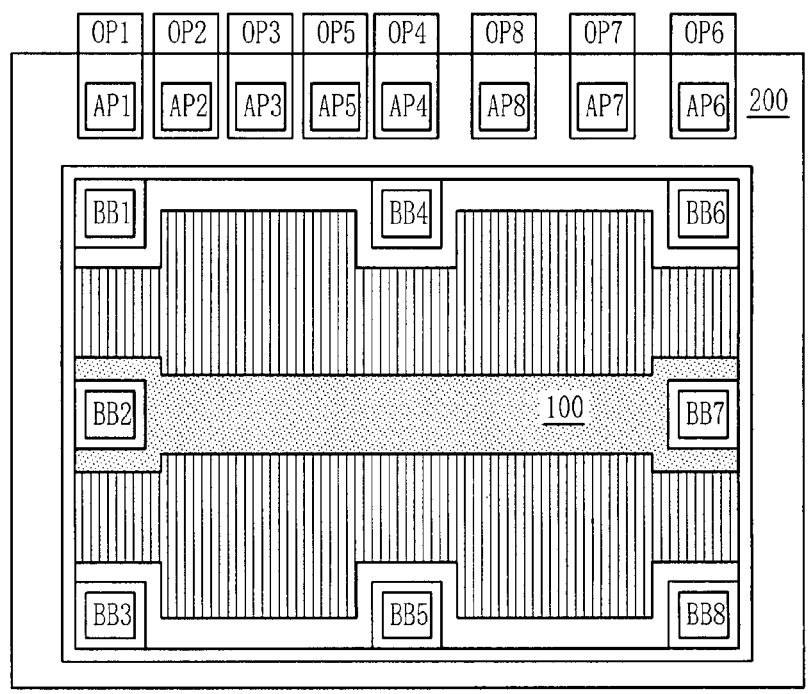
FIG. 18 illustrates a simplified top view of the cap wafer illustrated in FIG. 15 and the MEMS sensor illustrated in FIG. 17 after being bonded together.

After the completion of the serial processes illustrated in FIGS. 16A to 16D, as illustrated in FIGS. 15, 17 and 18, the bonding bumps BB1 to BB8 are coupled to the respective first and second plugs V1 to V8 and V1' to V8'. The sealing line SL is formed to encompass the bonding bumps BB1 to BB8, and the array bumps AB1 to AB8 are formed on the outer side of the sealing line SL.

Figure 19A:
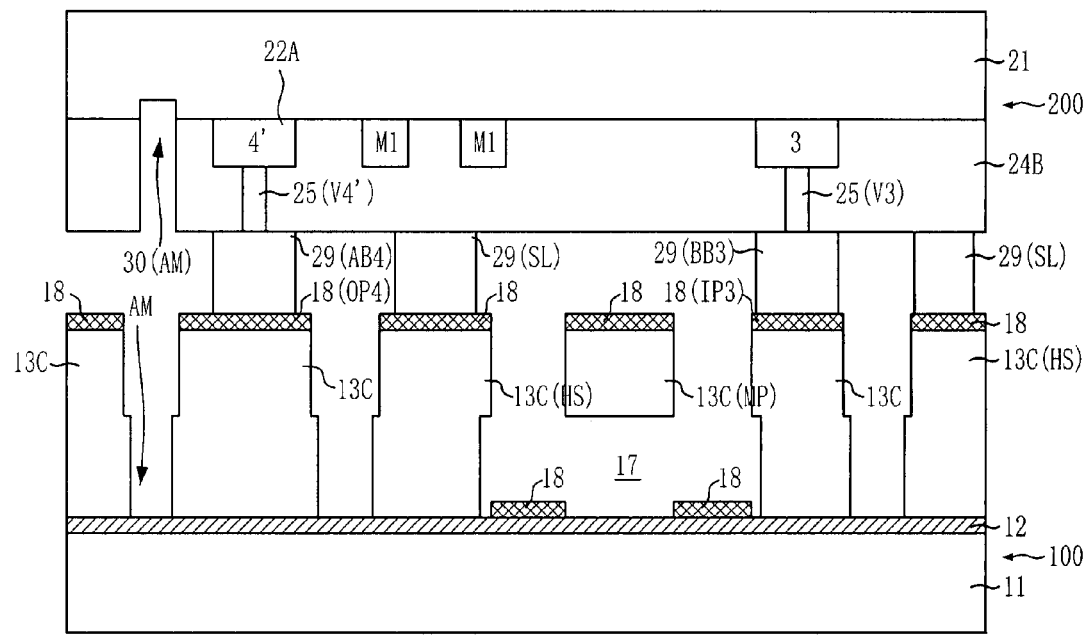
FIGS. 19A to 19D illustrate simplified cross-sectional views of structures associated with 'S58' through 'S61' illustrated in FIG. 5.

A packaging method will proceed as follows. As illustrated in FIGS. 5 and 19A, at step S58, the resultant substrate structures including the first substrate 200 and the second substrate 100 provided through the respective cap wafer and MEMS sensor fabrication processes are arranged to face each other and bonded together. The first substrate 200 and the second substrate 100 are aligned with each other in an image projection type, and then bonded together.

Figure 19B:
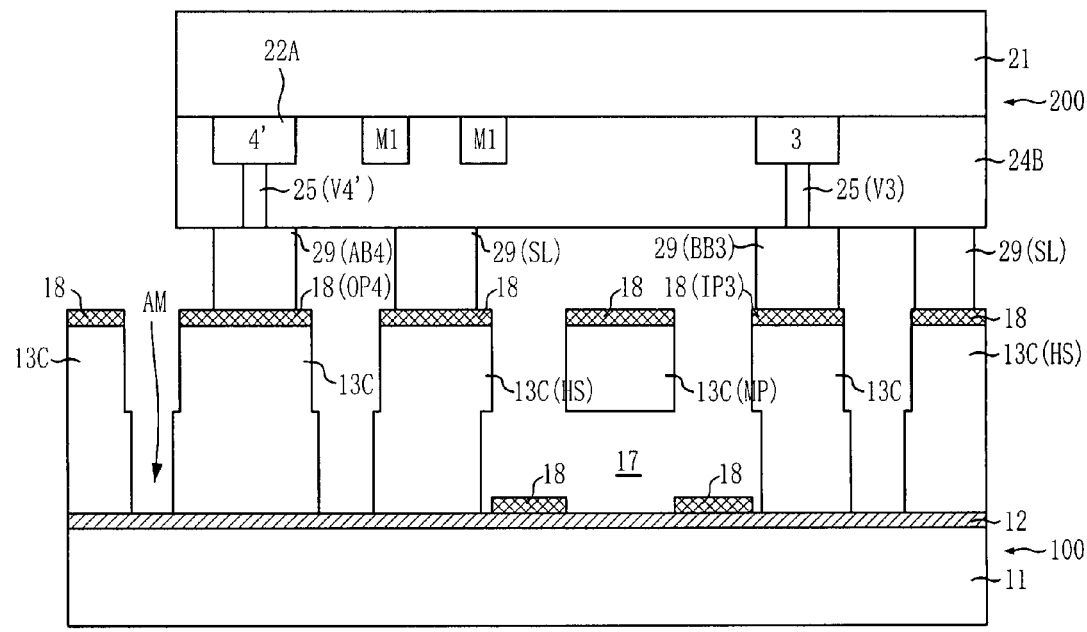

Referring to FIG. 19B, at S59, a rear surface of the first substrate 200 is ground. The back-grinding of the first substrate 200 proceeds to penetrate the other array mark AM, so as to automatically separate the structure disposed on the outer side of the array bumps AB1 to AB8 from the target structure based on the other array mark AM. Alternatively, the back-grinding proceeds to expose the other array mark AM, and an additional sawing process is performed for the separation of the structure disposed on the outer side of the array bumps AB1 to AB8 from the target structure based on the other array mark AM.

Figure 19C:
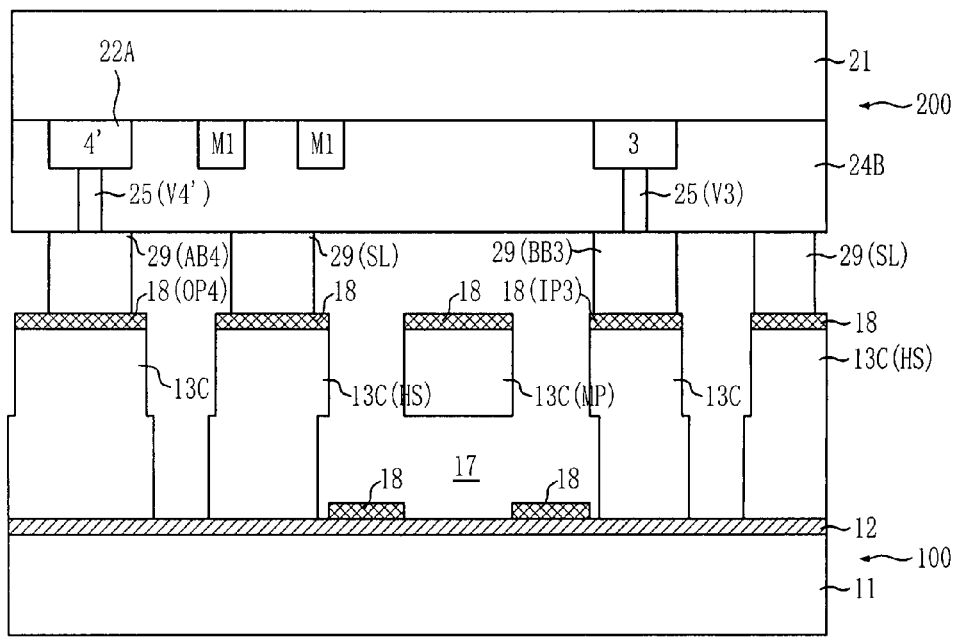

Referring to FIG. 19C, at step S60, a sawing process is performed on the array mark AM of the second substrate 100, so that the structure disposed on the outer side of the third patterned silicon-based layer 13C for supporting the outer pads OP1 to OP8 is separated from the target structure based on the array mark AM. At this time, the back-grinding can also be performed on the second substrate 100.

Figure 19D:
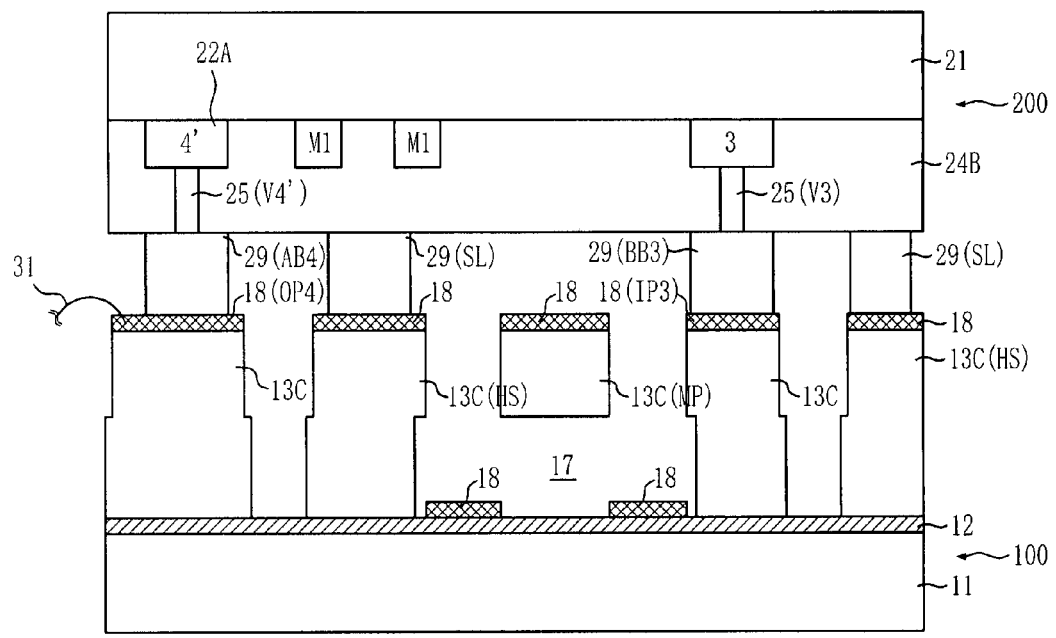

Referring to FIG. 19D, at step S61, a packaging process including forming a wire bonding 31 coupled to the outer pads OP1 to OP8 is performed. Instead of forming the wire bonding, the packaging process can proceed employing a soldering process, a bumping process, or a plastic molding process.

According to various embodiments of the present invention, the inner pads, the outer pads, and the inner interconnection lines are formed using a method of forming metal interconnection lines (e.g., Al metal interconnection lines) in a multiple-layer structure. As a result, variation in the height of the bonding bumps, which often occurs when the metal interconnection lines are formed from deep via holes, can be reduced. This reduction contributes to an improvement on yields of the bonding.

According to the embodiments of the present invention, the inner pads, the outer pads, and the inner interconnection lines are formed as bottom interconnection lines by performing dual layer metallization (DLM) on the cap wafer. Bumps that are electrically coupled to respective targets through the via plugs are formed. The bumps are used as the bonding bumps, the array bumps, and the sealing line. As a result, it is possible to increase a degree of freedom in an interconnection line layout, allow a hermetic sealing, and standardize the size of a chip.

According to the embodiments of the present invention, a spacer for the moving part of the MEMS sensor is secured based on the height of the bonding bumps, which are used as a bonding material. As a result, an additional process of forming a cavity can be omitted, thereby simplifying the entire fabrication process.

According to the embodiments of the present invention, interconnection lines (i.e., the inner and outer pads and the inner interconnection lines) are formed over the flat cap wafer instead of the wafer for the MEMS sensor based on the metal interconnection line formation method. In addition to the interconnection lines, a fabrication process of a logic chip on which a sensor driver integrated circuit or a non-volatile memory are installed can proceed with the cap wafer fabrication process. Thus, the high integration of the MEMS sensor can be achieved.

According to the embodiments of the present invention, the introduced method can be more easily applied to the entire semiconductor fabrication process as compared with the conventional fabrication method. Thus, high yields can be achieved, and a unit manufacturing cost can be reduced. In addition to sensors, the introduced method according to the embodiments of the present invention can be applied to a wafer level packaging process, a three-dimensional integration process and a SiP process.

While the present invention has been described with respect to various embodiments, it will be apparent to those skilled in the art that various changes and modifications may be made without departing from the spirit and scope of the invention as defined in the following claims.

What is claimed is:

1. A package of a micro-electro-mechanical systems (MEMS) device, the package comprising:
   a cap wafer;
   a plurality of bonding bumps formed over the cap wafer;
   a plurality of array bumps arrayed on an outer side of the bonding bumps;
   an MEMS device wafer over which a plurality of first outer pads are formed corresponding to the array bumps, wherein the array bumps are bonded to the respective outer pads when the cap wafer and the MEMS device wafer are bonded together; and
   a sealing line formed between the bonding bumps and the array bumps to encompass the bonding bumps.

2. The package of claim 1, wherein the bonding bumps and the sealing line are formed substantially at the same layer level.

3. The package of claim 1, wherein the cap wafer comprises:
   a plurality of first inner pads;
   a plurality of second outer pads;
   a plurality of inner interconnection lines respectively coupling the first inner pads to the second outer pads;
   an insulation layer covering the first inner pads, the second outer pads, and the inner interconnection lines;
   a plurality of first plugs formed in the insulation layer and respectively coupling the first inner pads to the bonding bumps; and
   a plurality of second plugs formed in the insulation layer and respectively coupling the second outer pads to the array bumps.

4. The package of claim 3, wherein the first inner pads, the second outer pads, and the inner interconnection lines are formed substantially at the same layer level.

5. The package of claim 3, wherein the first plugs and the second plugs are formed substantially at the same layer level.

6. The package of claim 1, wherein the MEMS device wafer comprises:
   a silicon on insulator (SOI) substrate;
   an insulation layer formed over the SOI substrate;
   a plurality of first and second supporting layers formed over the insulation layer and respectively supporting the first outer pads and a plurality of second inner pads;

a plurality of barrier walls separated from the first and second supporting layers and bonded to the sealing line;

the first outer pads formed over the first supporting layers and bonded to the respective array bumps;

the second inner pads formed over the second supporting layers; and a moving part supported by the second supporting layers.

7. The package of claim 6, wherein the first supporting layers, the second supporting layers, the barrier walls, and the moving part each include substantially the same material.

8. The package of claim 7, wherein the first supporting layers, the second supporting layers, the barrier walls, and the moving part each include a silicon-based material.

9. The package of claim 6, wherein the barrier walls are bonded to the sealing line.

10. The package of claim 6, wherein the cap wafer and the MEMS device wafer are separated to a certain distance by the sealing line and the barrier walls.

11. The package of claim 1, wherein the bonding bumps and the sealing line are formed to have substantially the same height.

12. The package of claim 1, wherein the first outer pads is formed in one of a single layer structure including one selected from a first group consisting of Ti, TiW, Ni, Cu, W, Au, Pt, Ag, Al, NiV, and CrV, and a stack structure including one selected from the first group and another selected from a group consisting of Au, Cu, and Ni.

13. The package of claim 1, wherein the first outer pads is formed in one of an under bump metallization (UBM) layer/Cu/solder cap structure and an UBM layer/Au/solder cap structure.

14. The package of claim 13, wherein the under bump metallization (UBM) layer is formed in one of a single layer structure including one selected from a first group consisting of Ti, TiW, Ni, Cu, W, Au, Pt, Ag, Al, NiV, and CrV, and a stack structure including one selected from the first group and another selected from a group consisting of Au, Cu, and Ni.

* * * * *